US012666834B2

(12) United States Patent
Boroson et al.

(10) Patent No.: US 12,666,834 B2
(45) Date of Patent: Jun. 23, 2026

(54) SEGMENTED OLED

(71) Applicant: OLEDWorks LLC, Rochester, NY (US)

(72) Inventors: Michael Boroson, Pittsford, NY (US); Jeffrey Spindler, Ontario, NY (US); Jörg Knipping, Wegberg (DE); Manfred Ruske, Kerpen (DE)

(73) Assignee: OLEDWorks LLC, Rochester, NY (US)

( * ) Notice: Subject to any disclaimer, the term of this patent is extended or adjusted under 35 U.S.C. 154(b) by 433 days.

(21) Appl. No.: 18/251,136

(22) PCT Filed: May 16, 2022

(86) PCT No.: PCT/US2022/029409
§ 371 (c)(1),
(2) Date: Apr. 28, 2023

(87) PCT Pub. No.: WO2022/250995
PCT Pub. Date: Dec. 1, 2022

(65) Prior Publication Data
US 2024/0196684 A1     Jun. 13, 2024

Related U.S. Application Data

(60) Provisional application No. 63/192,942, filed on May 25, 2021.

(51) Int. Cl.
H10K 59/18 (2023.01)
H10K 50/813 (2023.01)
(Continued)

(52) U.S. Cl.
CPC ........... H10K 59/18 (2023.02); H10K 50/813 (2023.02); H10K 50/858 (2023.02);
(Continued)

(58) Field of Classification Search
CPC .... H10K 59/18; H10K 59/131; H10K 59/179; H10K 59/879; H10K 50/813; H10K 50/858; H10K 77/10; Y02B 20/30
See application file for complete search history.

(56) References Cited

U.S. PATENT DOCUMENTS 7,336,036 B2    2/2008  Furuie et al.
7,408,296 B2    8/2008  Cok et al.
(Continued)

FOREIGN PATENT DOCUMENTS

CN        202183376 U      4/2012
CN        205303465 U      6/2016
(Continued)

OTHER PUBLICATIONS

Japan Patent Office, Notice of Allowance for equivalent application 2023-524958 in Japan, Jan. 7, 2025, with English translation appended. All references listed were cited in a previous IDS.
(Continued)

*Primary Examiner* — Jacob Y Choi
*Assistant Examiner* — Ashley Nicole Blackwell

(57) ABSTRACT

An OLED device comprising an array of bottom-emitting OLED segments, each separated by a non-emitting gap, arranged on a common transparent substrate; wherein each OLED segment is defined by a transparent bottom electrode segment together with a top electrode and organic layers for light emission between the top electrode and bottom electrode segments; where each segmented bottom electrode is electrically connected to an individual power feed, wherein at least some of the power feeds are arranged between the bottom electrode segments and the transparent substrate within the emission light path; and includes at least one refraction-reducing material located between the segmented bottom electrode and the transparent substrate. The refraction-reducing material is located between the bottom side of
(Continued)

the power feed and the upper side of the transparent substrate; and/or between the bottom side of the bottom electrode segments and the upper side of the power feed; and/or between the lateral spaces separating the individual power feeds.

17 Claims, 14 Drawing Sheets

(51) Int. Cl.
| | |
|---|---|
| *H10K 50/858* | (2023.01) |
| *H10K 59/131* | (2023.01) |
| *H10K 59/179* | (2023.01) |
| *H10K 59/80* | (2023.01) |

(52) U.S. Cl.
CPC .......... *H10K 59/131* (2023.02); *H10K 59/179* (2023.02); *H10K 59/879* (2023.02)

(56) References Cited

U.S. PATENT DOCUMENTS

| | | | | |
|---|---|---|---|---|
| 8,653,509 | B2 | 2/2014 | Popp | |
| 8,829,501 | B2 | 9/2014 | Jobert | |
| 8,941,143 | B2 | 1/2015 | Smith | |
| 9,159,945 | B2 | 10/2015 | Pang et al. | |
| 9,487,878 | B2 | 11/2016 | Baker et al. | |
| 9,583,731 | B2 * | 2/2017 | Okumura | H10K 50/858 |
| 9,627,643 | B2 | 4/2017 | Wehlus | |
| 9,692,005 | B2 | 6/2017 | Wehlus | |
| 10,068,958 | B2 | 9/2018 | Regau et al. | |
| 10,141,535 | B2 | 11/2018 | Wehlus et al. | |
| 10,379,269 | B2 * | 8/2019 | Lee | C03C 17/23 |
| 10,466,820 | B2 | 11/2019 | Wang et al. | |
| 10,497,891 | B2 | 12/2019 | Kim et al. | |
| 10,720,608 | B2 | 7/2020 | Ko et al. | |
| 2004/0032220 | A1 * | 2/2004 | Cok | H10K 59/86 |
| | | | | 315/169.3 |
| 2006/0108915 | A1 | 5/2006 | Cok et al. | |
| 2007/0096112 | A1 | 5/2007 | Hoshi | |
| 2007/0132378 | A1 | 6/2007 | Cok et al. | |
| 2009/0188726 | A1 | 7/2009 | Chang et al. | |
| 2011/0198622 | A1 * | 8/2011 | Amelung | H10K 59/8051 |
| | | | | 257/E51.001 |
| 2014/0049822 | A1 | 2/2014 | Gollier et al. | |
| 2014/0267443 | A1 | 9/2014 | Chan et al. | |
| 2015/0041782 | A1 | 2/2015 | Chery et al. | |
| 2015/0123911 | A1 | 5/2015 | Poliakov et al. | |
| 2017/0205542 | A1 | 7/2017 | Lee et al. | |
| 2017/0207411 | A1 | 7/2017 | Hoefling et al. | |
| 2019/0019976 | A1 * | 1/2019 | Kim | H10K 59/879 |
| 2019/0165319 | A1 | 5/2019 | Kim et al. | |
| 2019/0198820 | A1 * | 6/2019 | Ko | H10K 59/221 |
| 2019/0363155 | A1 | 11/2019 | Xiao et al. | |

FOREIGN PATENT DOCUMENTS

| | | | |
|---|---|---|---|
| JP | 2002075662 A | 3/2002 | |
| JP | 2007-080579 A | 3/2007 | |
| JP | 2007-302799 A | 11/2007 | |
| JP | 2015-503823 A | 2/2015 | |
| JP | 2015-158638 A | 9/2015 | |
| JP | 2015-193758 A | 11/2015 | |
| JP | 2015-534096 A | 11/2015 | |
| JP | 2015-220087 A | 12/2015 | |
| JP | 2017-528399 A | 9/2017 | |
| JP | 2020-173300 A | 10/2020 | |
| JP | 2021-051949 A | 4/2021 | |
| TW | I666804 B | 7/2019 | |
| WO | 2013/038971 A1 | 3/2013 | |
| WO | 2014/041764 A1 | 3/2014 | |
| WO | 2015/029202 A1 | 3/2015 | |
| WO | 2018017318 A1 | 1/2018 | |

OTHER PUBLICATIONS

Korea Patent Office, Office Action Feb. 10, 2025, with appended English translation by KR patent agent. Previously cited references crossed out in English translation.

European Patent Office, Extended European Search Report, Mar. 17, 2025. Documents references (p. 2) previously reported are crossed out.

Bechert et al, "Flexible and highly segmented OLED for automobile applications", Proc. Of SPIE, vol. 10687, SPIE Photonics Conference Europe, 2018.

Machine translation of CN2021183376U.

Machine translation of JP2002075662A.

Taiwan Patent Office, Office Action of Jul. 7, 2023, p. 7-8.

Lee and Li, Patent Attorneys, communication Jul. 11, 2023.

Translation of Office Action (from Lee and Li, Patent Attorneys).

Japan Patent Office Office Action Apr. 16, 2024 (original, in Japanese).

Japan Patent Office Office Action Apr. 16, 2024—Machine translation.

JP 2020-173300 machine translation.

JP 2021-051949 machine translation.

WO 2015/029202 machine translation.

JP 2015-158638 machine translation.

JP 2015-193758 machine translation.

WO 2013/038971 machine translation.

JP 2007-302799 machine translation.

CN 205303465 machine translation.

* cited by examiner

FIG. 12B
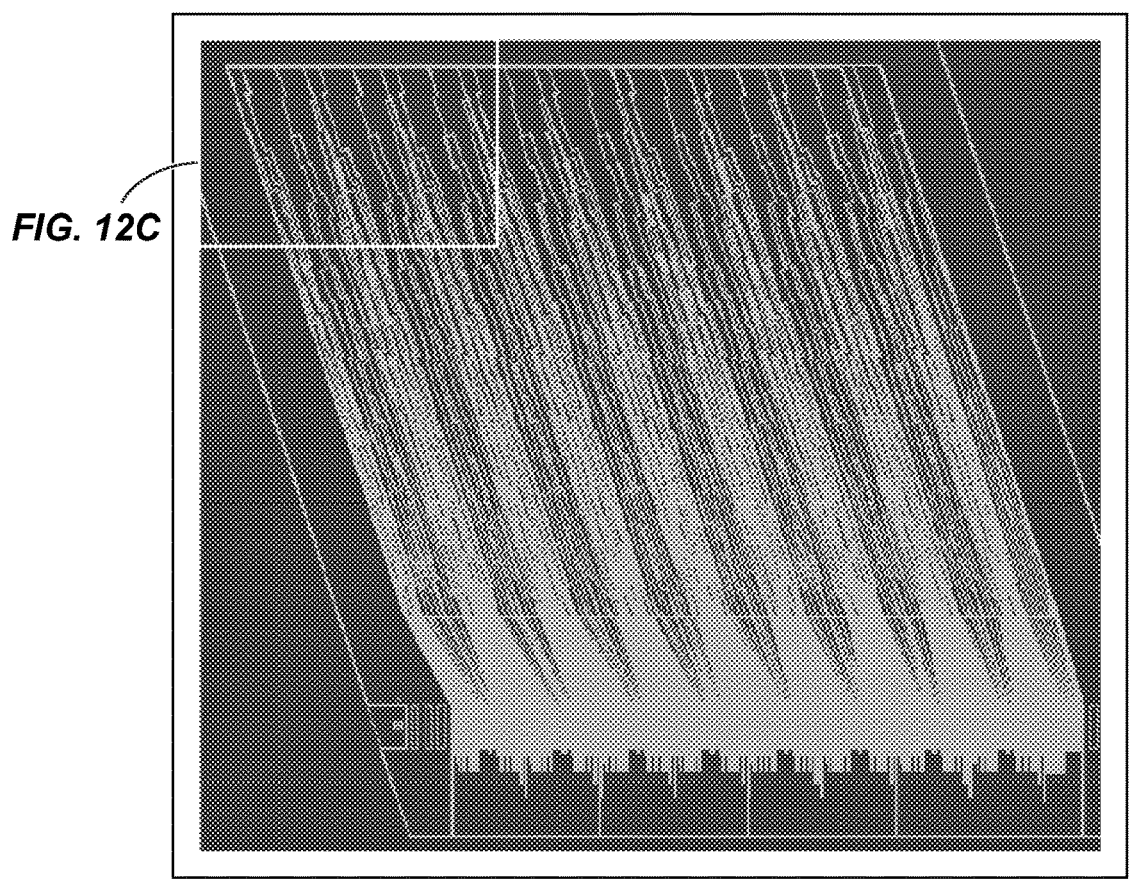
FIG. 12C
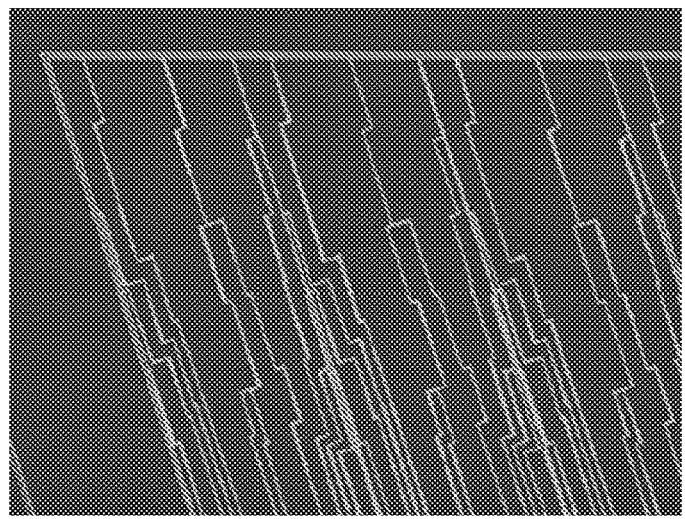
FIG. 12C

SEGMENTED OLED

CROSS REFERENCE TO RELATED APPLICATIONS

This application claims the benefit of U.S. Provisional Application No. 63/192,942 filed May 25, 2021.

BACKGROUND

LED and OLED lighting panels offer many advantages for general lighting purposes. They are efficient in terms of light output for power consumed. They are low voltage which helps avoid potential electrical shocks, less prone to sparking in potentially explosive environments and reduce loads in the supporting electrical system. The spectrum of emitted light can be varied using appropriate internal designs. They produce little or no UV or IR light. They are instant on; that is, they emit light immediately whenever electrical power is supplied.

LED light sources are inherently small point sources and in order to serve as a flat general lighting source, many separate LED devices must be ganged together. This raises manufacturing costs and complexity. Uniformity of the light surface must be controlled by appropriate design. LEDs produce some heat and so, heat sinks or other thermal control measures are often employed. Practical LED lighting panels can be made very thin, for example as thin as 3-16 mm, with appropriate system design.

OLED light sources are inherently flat area light sources. They offer several advantages over LED lighting panels. They can be made even thinner (for example, less than 1 mm thick) and they produce very little heat under normal operating conditions. However, OLED lifetimes can be an issue. Both LED and OLED lighting panels can be made on flexible or curved substrates even though OLED is preferred for these types of applications. In summary, both LED and OLED devices can be useful as lighting panels. They are both efficient, low voltage, cool to the touch, and are thin.

For some applications, multiple independently controlled individual OLED or LED devices can be mounted on a single substrate to provide a 'tiled' device. In this application, each independent OLED or LED light source is previously and independently manufactured in its entirely (except for electrical connections) including its own substrate and mounted side-by-side or in an array. Such devices can provide either variable general lighting (i.e., by supplying power to the individual units according to desired amount of overall light) or a low-resolution communication device (i.e., by supplying power to the individual units in a pattern). OLED panels are often advantaged for this usage since the OLED can have a larger emission area than an individual LED. This provides a larger fill factor (total area of light emission) which is often desirable. In order to provide a larger emission area with LED light sources, it is necessary to use multiple LEDs, all sharing the same power source, within the same area. This increases manufacturing complexity and cost and does not provide a uniform appearance without the use of diffusers (which decrease efficiency of light output and decrease sharpness and contrast at the edges of the emission area).

For other applications, multiple independently controlled individual OLED devices can be manufactured directly on a single common substrate to provide a 'segmented' OLED device. In this application, a segmented OLED has each independent OLED segment manufactured directly in its entirely side-by-side or in an array on the same substrate.

There are non-emitting gaps or spaces between the individual segments. Such segmented OLED light sources can offer manufacturing and cost advantages because many layers can be shared across all the individual units and there is no need to handle or mount the separate OLED panels. Because LEDs must be individually manufactured on their own substrate, it is not possible to make a true segmented LED device where all the LEDs share a common internal substrate. Segmented OLED devices can provide either variable general lighting or a low-resolution communication device.

Segmented OLED devices are particularly suitable for automobile exterior lighting applications (e.g., tail-lights) since they, unlike LED devices, require no additional reflectors, light guides, or additional optics to generate homogeneous surface light. For example, see M. Kruppa et al, Information Display 4/19, p. 14-18 (2019). Moreover, applications such as automobile tail-lights often require some degree of visibility from the side as well as directly from the rear so the tail-light assembly often has a complex design with a mixture of curved and relatively flat surfaces. Segmented OLED devices can be prepared on flexible substrates which simplifies design considerations in a non-planar tail-light assembly. However, automobile tail-light assemblies are an integral part of the overall exterior appearance of the vehicle and must provide a sleek and compatible design and appearance.

In general, OLED devices are formed on a substrate and can be either top-emitting (light emission from the surface opposite the substrate) or bottom-emitting (light emission through a transparent substrate). In order to create an individually controlled OLED segment, at least one of the electrodes must be divided into segments; that is, the electrode for one OLED segment is electrically separated from a corresponding electrode in a different OLED segment. In this way, the emission from each of the OLED segments can be individually controlled by a single unique electrical power feed to the electrode segment.

Although both top-emitting and bottom-emitting OLEDs are suitable for automobile applications, bottom-emitting OLED are preferred for at least two reasons. First, robust encapsulation is necessary for exterior applications. This is more difficult to achieve with transparent encapsulation, particularly for flexible OLEDs, which is required for a top-emitting OLED. A bottom-emitting OLED can use very robust encapsulation since the encapsulation on the non-emitting side does not need to be transparent. Second, the OLED will be located in a confined space where heat build-up can be problematic. A bottom-emitting OLED allows for a heat sink to be located on the back side. With a top-emitting OLED, the heat sink is located on the opposite side of the substrate which reduces the rate of heat transfer and so, cooling is not as efficient.

The power leads are desirably formed directly on the substrate before any of the organic OLED layers are applied. This is because they must be individually patterned since there is at least one power lead for each segment. One cost-effective way to manufacture the power leads is to use photolithographic processes and techniques that are capable of forming very fine patterns of conductive structures. However, photolithography is generally not compatible when used over organic OLED layers. Fine metal masking processes and techniques can be used to create the power lines, even over organic OLED layers, but it would be more expensive and more prone to defects during manufacture.

The conductive structures created by masking processes are also significantly larger than those that can be made using photolithography.

The need to have a separate electrical power feed (also referred to as power lead, bus line, metal trace, conductive trace, lead or current trace) for each segment in a segmented OLED device creates a number of design issues. In particular, locating the power feeds directly on a transparent substrate under the transparent bottom electrode in a bottom-emitting OLED can be problematic. If the power feeds are located under the active area of the OLED segment, they can be visible because of light absorbance or light scattering. This is undesirable. Moreover, depending on their reflectivity, they might be visible even when the segment is off and not-emitting because of incident light entering the OLED and being reflected off the power feed. The visibility of the power lines at any time would be detrimental to the sleek and uniform appearance of the segmented OLED device.

This problem is illustrated in FIG. 1 which is a top-view photograph of a prior art bottom-emitting segmented OLED device where the power leads are located under the electrode segments and in the emission light path. In this particular example, the individual OLED segments are arranged in an array of triangles and hexagons with non-light emitting gaps between them. The underlying individual power feeds are made of ITO and run directly under the OLED segment and in the emission light pathway. The power feeds are separated from each other laterally as well as separated from the overlying electrode segments by an insulating layer of SiO$_2$. In this arrangement, the power feeds are clearly visible and the entire segmented OLED device does not have a sleek and clean appearance.

The electrical power feeds are generally made of conductive materials such as metal oxides, metals, conductive polymers, carbon nanotubes and the like. They must be conductive enough to supply the power over a distance, which can be in some instances relatively long (for example, interior segments), without significant IR (current×resistance or voltage) drop due to resistance. This can result in uneven luminance. Generally speaking, the amount of IR drop is inversely proportional to the conductance, which for any particular material, is controlled by its thickness (height), width and length. In many cases, even if the material is mostly transparent, the required thickness and width necessary to provide sufficient conductance can cause the power lead to become visible. If they are thin enough to be almost invisible, then the amount of power loss due to IR drop may be unacceptably large. For this reason, it would be desirable for the electrical power feeds to be located in the non-emitting gaps between the individual OLED segments so the power leads are not visible. Typically, the non-emitting gaps between the individual OLED segments will be consistent in width to provide a uniform appearance and will be as thin as possible in order to maximize the emission area.

However, locating the power leads in the non-emitting gaps between OLED segments can be problematic. First, all power leads (one per individual OLED segment) must be separate and electrically isolated from each other so that each segment can be independently controlled and there are no short circuits. Depending on the arrangement of the OLED segments and the width of the gaps, it may not be possible to place all of the necessary power leads in the limited area of the non-emitting gap without have to cross one lead over another lead without contact between them. This would greatly increase manufacturing costs. Second, the power leads for OLED segments along or close to the edges of the device are relatively short while the power leads to those OLED segments in the interior of the device are relatively long, particularly if the path of the power lead is convoluted because it is restricted to the gaps between the segments. Assuming a common power source, the power delivered by a longer power lead may be less than that delivered by a shorter power lead due to its increased resistance (IR drop). This can result in uneven emission where the interior segments have lower emission than those along the edges of the device. For this reason, the power leads to the interior OLED segments may need to be larger in size (to reduce resistance) and the gap may not be wide enough to allow for multiple larger power leads. For these reasons, it is often impractical to locate all of the power leads in the gaps between the OLED segments.

To avoid these issues, many previous approaches to segmented OLED devices are based on top-emitting OLED formulations where the underlying electrical power feeds are not visible. However, there still exists a need to arrange the power feeds on the substrate in a segmented bottom-emitting OLED device so that any power leads located directly under the individual OLED segments are not visible.

Bechert et al, "Flexible and highly segmented OLED for automobile applications", Proc. Of SPIE, Vol. 10687, SPIE Photonics Conference Europe, 2018 describes a top-emitting OLED where the bottom electrode of each segment is electrically connected to metal traces located on the substrate by vias through a polymeric insulating layer that separates the two.

U.S. Pat. No. 8,653,509 and US2017/0207411 disclose a top-emitting OLED with a segmented bottom electrode which is separated from an underlying uniform electrically conductive layer by an insulating layer which connects to the individual segments through a via in the insulating layer.

U.S. Pat. No. 9,692,005 discloses bottom-emitting OLEDs where electrically conductive tracks for the segmented bottom electrodes are located over the top reflective electrode and are connected through vias in an insulating layer.

U.S. Pat. No. 8,829,501 discloses a top-emitting OLED having a current supply layer which is electrically connected to a bottom electrode by an electrical feedthrough in an electric insulating layer between the current supply layer and the bottom electrode.

CN202183376 describes a top-emitting segmented OLED with a substrate, an electrical bus, an insulating layer, and a common electrode, which is in contact with the electrical bus through vias in the insulating layer.

U.S. Ser. No. 10/141,535 describes a segmented OLED device where a bottom electrode is divided into outer and inner segments. On the bottom electrode is a patterned current distribution structure which is covered by an insulating structure.

U.S. Pat. Nos. 8,941,143 and 9,487,878 describe segmented OLEDs with electrically conductive tracks that extend though the device and which are in contact with a hole-injection track. The conductive metal tracks are visible within the emission area and are connected to a busbar lying around the perimeter. U.S. Pat. No. 9,487,878 also describes the use of conductive tracks that vary in thickness (height) or width from the outside to the inside segments to address the problem of IR drop. A similar concept of conductive layers with thickness variations to address IR drop is disclosed in U.S. Pat. No. 9,159,945.

U.S. Pat. No. 7,408,296 describes a segmented (passive-matrix) OLED with electrode buses on a substrate, an insulating layer over the electrode buses, segmented electrodes over the insulating layers and arranged so that the segmented electrode is in contact with one of the electrical buses outside the area covered by the insulating layer.

U.S. Ser. No. 10/068,958 describes a segmented OLED where electrically conductive tracks are located between the segments.

U.S. Pat. No. 9,627,643 describes an OLED with two electrodes and electrically conductive tracks where the electrodes and the conductive tracks are all transparent.

US2006/0108915 describes tiled OLED array (passive-matrix) where the electrodes of the OLEDs are connected to an outside power source along their edges.

U.S. Ser. No. 10/466,820 discloses an OLED with integral touch-sensing capabilities where there are two electrodes for the touch sensor that run in different directions. One of the touch electrodes is divided into sub-electrodes lines which are covered by an insulating layer. These sub-electrodes are connected to a metal bridge line by vias.

U.S. Pat. No. 7,336,036 describes OLEDs where differently sized busbars (located outside the emitting area) according to the power to be supplied to a pixel are connected to the electrode through vias in an insulating layer.

JP2002075662 describes a segmented OLED display where over a transparent substrate is a first electrode segment, an insulating layer, a second electrode segment, organic layers for emission, and a second electrode.

US20190363155 discloses an OLED with a patterned first conductive layer on one side of an insulating substrate and a common second conductive layer on the opposite side of the insulating substrate which are connected together by vias.

WO2018/017318 discloses a formulation for touch screens with an index-matching layer over or under a pattern of ITO electrodes in order to reduce the visibility of the ITO. There can be a $SiO_2$ layer over the index-matching layer. Both the index-matching and $SiO_2$ layers are deposited using wet methods.

US20150123911 and US20090188726 disclose the use of index-matching polymer layers in touch screen applications in order to reduce scattering and other optical properties due to the presence of the ITO gridlines.

In order to reduce or eliminate the visibility of power feeds that must be located in the pathway of light emission, it is very desirable that the reflectance difference ($D_R$) between the regions of the transparent substrate where the power feeds are located and the regions of the transparent substrate where the gaps between the power feeds are located should be 5% or less, or preferably 1% or less. Meeting these requirements will result in a device where the power feeds are not visible or have much reduced visibility.

Summary of Important Features

Some of the important features include:

An OLED device comprising an array of multiple bottom-emitting OLED segments arranged on a common transparent substrate, each individual OLED segment being separated by a non-emitting gap; wherein each OLED segment is defined by a transparent bottom electrode segment together with a top electrode and organic layers for light emission between the top electrode and bottom electrode segments; where each segmented bottom electrode is electrically connected to an individual power feed, wherein at least some of the power feeds are arranged between the bottom electrode segments and the transparent substrate within the emission light path; and includes at least one refraction-reducing material located between the segmented bottom electrode and the transparent substrate.

The above OLED device wherein the refraction-reducing material is located between the bottom side of the bottom electrode segments and the upper side of the power feeds; and/or between the bottom side of the power feeds and the upper side of the transparent substrate; and/or between the lateral spaces separating the individual power feeds. Any of these possible locations are suitable and can be combined in total or in part. In some embodiments, the refraction-reducing material forms a uniform or patterned layer located over the top surface of the power feeds and under the bottom electrode(s). In other embodiments, the refraction-reducing material can be patterned so as to be located only in the lateral spaces between the power feeds.

Any of the above OLED devices, wherein the refraction-reduction material is a continuous layer located between the bottom side of the bottom electrode segments and the upper side of the power feeds. The uniform layer can also be patterned so it is located only in the light emitting area of the OLED device and does not extend beyond the encapsulation area of the OLED device. The refraction-reduction material may be additionally located in the lateral spaces separating the individual power feeds.

Any of the above OLED devices wherein there is an additional insulating layer located between the upper surface of the power feeds and the bottom surface of the bottom electrode segment. The insulating layer may be located between the refraction-reduction material and the bottom side of the bottom electrode segments.

Any of the above OLED devices where the reflectance difference ($D_R$) between the regions of the transparent substrate where the power feeds are located and the regions of the transparent substrate where the gaps between the power feeds are located is 5% or less. The ratio (higher $R_f$/lower $R_f$) of the refractive index $R_f$ of the power feed and the refractive index $R_f$ of the refraction-reduction material may be in the range of 1.00 to 1.06.

Any of the above OLED devices where the refractive-reduction material comprises two or more inorganic materials with different refractive indexes. The power feeds may be formed from conductive metal oxide and the refraction-reduction material is a mixture of $Nb_2O_5$ and $SiO_2$; or where the refraction-reduction material comprises a suspension of inorganic particles in an organic polymer. The power feeds may be formed from conductive metal oxide and the refraction-reduction material is a mixture of inorganic nanoparticles suspended in a polymer matrix comprising polymeric siloxanes with high molecular weight organic functional groups.

Any of the above OLED devices where all of the OLED segments in the array emit the same color of light. Red light is particularly desirable.

Any of the above OLED devices where some of the OLED segments emit a different color of light from other segments. At least one of the OLED segments in the array may be located within and is entirely surrounded by another OLED segment.

Any of the above OLED devices where the refraction-reducing material is in direct contact with at least one surface of the power feed. The refraction-reducing material is electrically insulating.

In some of the above OLED devices, the power feeds is located over the transparent substrate, with a layer of the refraction-reducing material located over the power feeds and below the bottom side of the electrode segments.

Alternatively, a layer of the refraction-reducing material is located over the power feeds and below the bottom side of the electrode segments and between the lateral spaces separating the individual power feeds.

Any of the above OLED devices where all of the OLED segments are at least two-stack OLEDs; preferably three-stacks or more.

BRIEF DESCRIPTION OF THE DRAWINGS

FIG. 12B is a top-view of the layout of the power feeds in a portion of FIG. 12A before deposition of the electrode segments. FIG. 12C is an enlargement of a section of the power feed layout shown in FIG. 12B.

DETAILED DESCRIPTION

Figure 1:
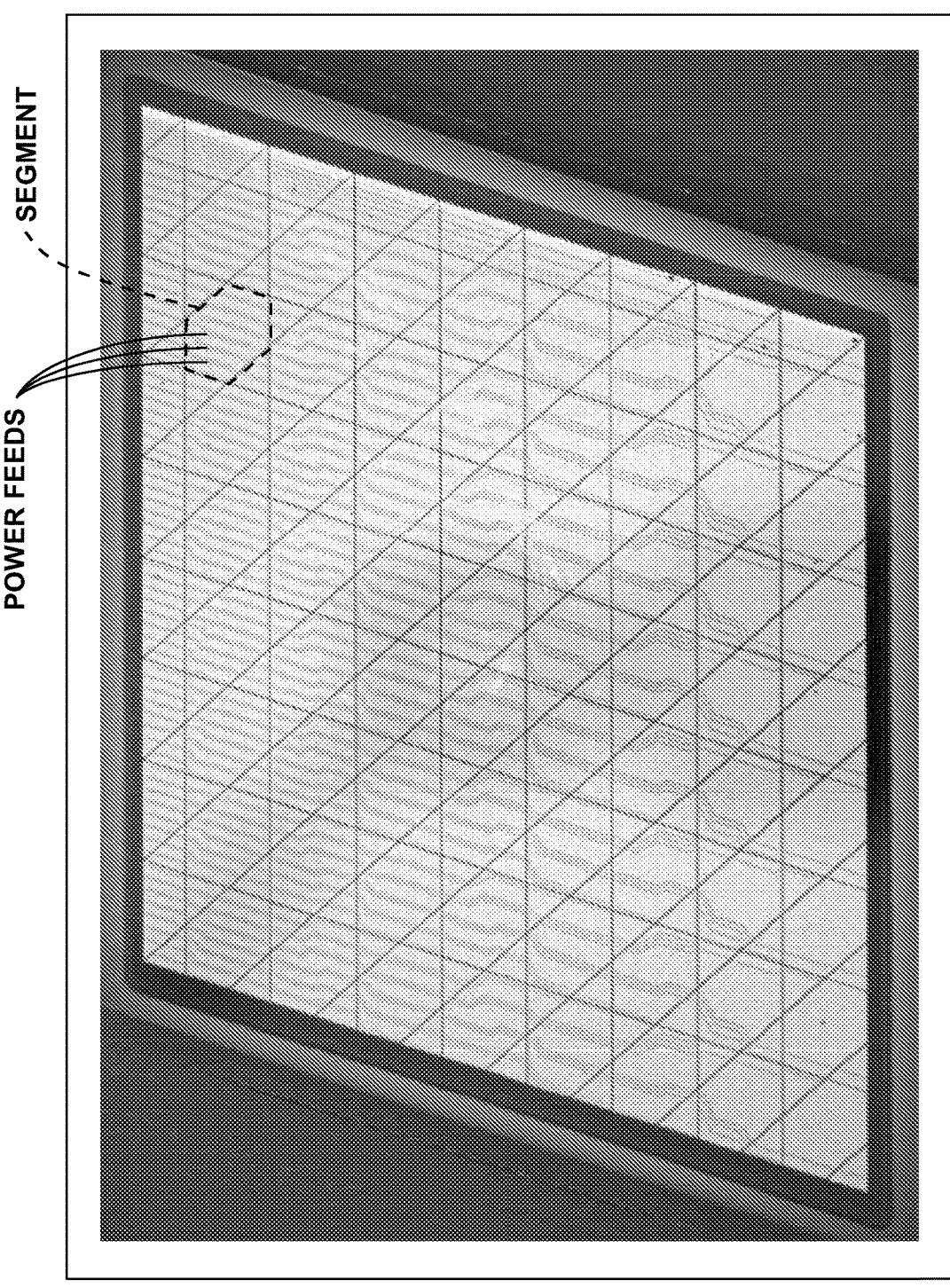
FIG. 1 is a top-view photograph of a prior art bottom-emitting segmented OLED device where the power feeds to the individual OLED segments, which are located below the electrode segment and in the light path of emission, are visible.

For the purposes of this disclosure, the terms "over" or "above" mean that the structure involved is located above another structure, that is, on the side opposite from the substrate. "Uppermost" or "upper" refers to a side or surface furthest from the substrate while "bottommost" or "bottom" refers to the side or surface closest to the substrate. Unless otherwise noted, "over" should be interpreted as either that the two structures may be in direct contact or there may be intermediate layers between them. By "layer", it should be understood that a layer has two sides or surfaces (an uppermost and bottommost) and that multiple layers could be present and is not limited to a single layer. "LEL" always refers to a single light-emitting layer. "Unit" generally indicates a minimum of one layer that can be considered to act as one single source of light; a unit may be equivalent to a single LEL, may contain one LEL associated with other non-emitting layers, or may have multiple LELs with or without additional layers. A light-emitting unit is a grouping of one or more LELs that are separated from another light-emitting unit by a charge-generating layer (CGL). Thus, if an OLED device does not have a CGL, there are no light-emitting units, even though it may have multiple LELs. Such a device is often referred to as a "one-stack" device. If an OLED device has two light-emitting units, separated by a CGL, then it can be referred to as a "two-stack" device. A stacked OLED may have multiple units or combinations of units and LELs, that together make up the total emission.

R indicates a layer or unit that primarily emits red light (>600 nm, desirably in the range of 620-660 nm), G indicates that a layer or unit primarily emits green light (500-600 nm, desirably in the range of 540-565 nm) and B indicates a layer or unit that primarily emits blue light (<500 nm, desirably in the range of 440-485 nm). It is important to note that R, G and B layers can produce some degree of light outside the indicated range, but the amount is always less than the primary color. Y (yellow) indicates that a layer or unit that emits significant amounts of both R and G light with a much lesser amount of B light. Unless otherwise noted, wavelengths are expressed in vacuum values and not in-situ values.

The OLED light-emitting element of the invention can be a single LEL, a single-stack OLED, a two-stack OLED, or even three or more OLED stacks, which can emit a single color or multiple colors. If a single-color light output is desired or the color temperature of the light output needs to be adjusted or modified, color filters may be used to eliminate any unwanted wavelengths.

An OLED light-emitting LEL or unit can produce a single "color" of light (i.e., R, G, B, combination colors of 2 primary colors, such as Y or cyan, or W (white)). The individual OLED light-emitting units may have a single light-emissive layer or may have more than one light-emitting layer (either directly adjacent to each other or separated from each other by an interlayer). The individual light-emitting units may also contain various kinds of non-emitting layers such as hole transporting layers, electron-transporting layers, blocking layers and others known in the art to provide desirable effects such as promoting emission and managing charge transfer across the light-emitting unit. The single color of light may be generated within the OLED unit by a single layer with one or more emitters of the same color or multiple layers, each with the same or different emitters whose primary emission fall within the same color. The single color provided by the OLED unit can be a combination of two primary colors; in particular, a yellow light-emitting OLED unit that produces a combination of R and G light. In this case, yellow counts as a single color.

A stacked OLED device can produce a single color of light or more than one color of light (multimodal). For example, a multimodal OLED produces a white light with roughly equal amounts of R, G and B light. Typically, this would correspond to $CIE_x$, $CIE_y$ values of approximately 0.33, 0.33. White light, even if does not contain equal amount of R, G, B light, can generally be produced in OLEDs by having three separate R, G and B light-emitting layers, two separate light emitting layers such as blue and yellow, or even a single white light-emitting layer. A red light-emitting OLED would have $CIE_x$, $CIE_y$ values of approximately 0.6-0.7, 0.2-0.35. The OLEDs of the invention van utilized a microcavity effect to increase the emission of a desired color of light.

For specific applications such as automobile taillights which are used to signal braking, stopping, turning and other functions, the light-output of the OLED used should be chosen to meet all government regulations and SAE or industry standards that apply to that use, particularly in terms of color and luminance. In addition, the size and dimensions of the segmented OLED device should be chosen to conform to all appropriate government regulations and industry standards that apply to the particular use. For such applications, the preferred emission color is red.

The segmented OLED device, which is comprised of multiple individual OLED segments on a common substrate, may have any shape as desired. It may be entirely flat or planar, may have multiple planar surfaces angled to each other, may be entirely curved, or may have a mixture of flat, angled or curved surfaces. The segmented OLED devices will often be mounted in a housing or part of a module, along with any necessary external power connections and control elements that supply a signal or power to the individual segments. The housing or module will typically have transparent sections that allow the light for the OLED device to pass out and yet provide protection from the outside environment. The housing or module might also have internal reflectors or light guides to help direct light emission as desired. The entire housing or module containing the segmented OLED device can be hermetically sealed.

In a segmented OLED device, each individual OLED segment should have uniform light emission across the active area of the segment, is not subdivided and is powered by a single source and signal. A segmented OLED device with individually controlled segments arranged in array can be used for lighting purposes where all segments are activated at the same time to provide uniform light emission (except for the gaps between the segments). The light emission across all segments can be constant, dimming as one, brightening as one or flashing on/off. Alternatively, the segmented OLED device can have each segment activated individually and independently in some sort of a pattern. The pattern may involve some segments which are fully on, some at intermediate luminance levels and some that are off. The pattern may be unchanging over some period of time or may be moving, where the individual segments are activated on/off in some type of time-based or location-based sequence. Since segmented OLED devices are not high-resolution displays and are typically meant to be viewed from a substantial distance, the individual OLED segments are substantially larger than the individual pixels in a high-resolution display (which typically have an emission area much less than 0.1 mm$^2$). Desirably, for smaller segmented OLED devices with a total emission area of 500 cm$^2$ or less, the individual OLED segments should have an emission area of at least 1 mm$^2$ and desirably at least 3 mm$^2$. For larger sized segmented devices with a total emission area of greater than 500 cm$^2$, the individual OLED segments should have an emission area of at least 0.25 cm$^2$, more desirably at least 1.0 cm$^2$; and most desirably, at least 10 cm$^2$.

The individual OLED segments can be of any shape or area as desired. Generally, in order to minimize the non-emitting space between the individual segments, the segments will form a packed array. Desirably, the array is a regular array so that the spacing between the segments is uniform and provides a sleek appearance. The array can take any overall form in terms of shape and need not be square or rectangular, but also can be circular, oval, triangular, or polygonal. In some designs, some areas of the array are regular with uniform spacing between them and other parts of the array are irregular. For example, in a square array, the outside of the array can have smaller square segments set in a uniform pattern while the interior area has a single larger star shaped segment in the exact center surrounded a large non-emitting area. Likewise, the shape of individual OLED segments within the array are not limited, but can be square, rectangular, circular, oval, triangular, or polygonal or even irregular as desired.

Moreover, the OLED segments within the array need not be all the same shape, but may have a mixture of shapes such as, for example, interlocked triangles and hexagons. Preferred are packed arrays with only triangles, only parallelograms or a mixture of triangles and hexagons or triangles and trapezoids. The individual segments may not have all the same area and the array may be composed of a mixture of large and small segments. The individual segments in the array need not emit the same color (although each individual segment will emit a single color) and the segments that emit different colors can be located in a specific pattern within the array.

Figure 2A:
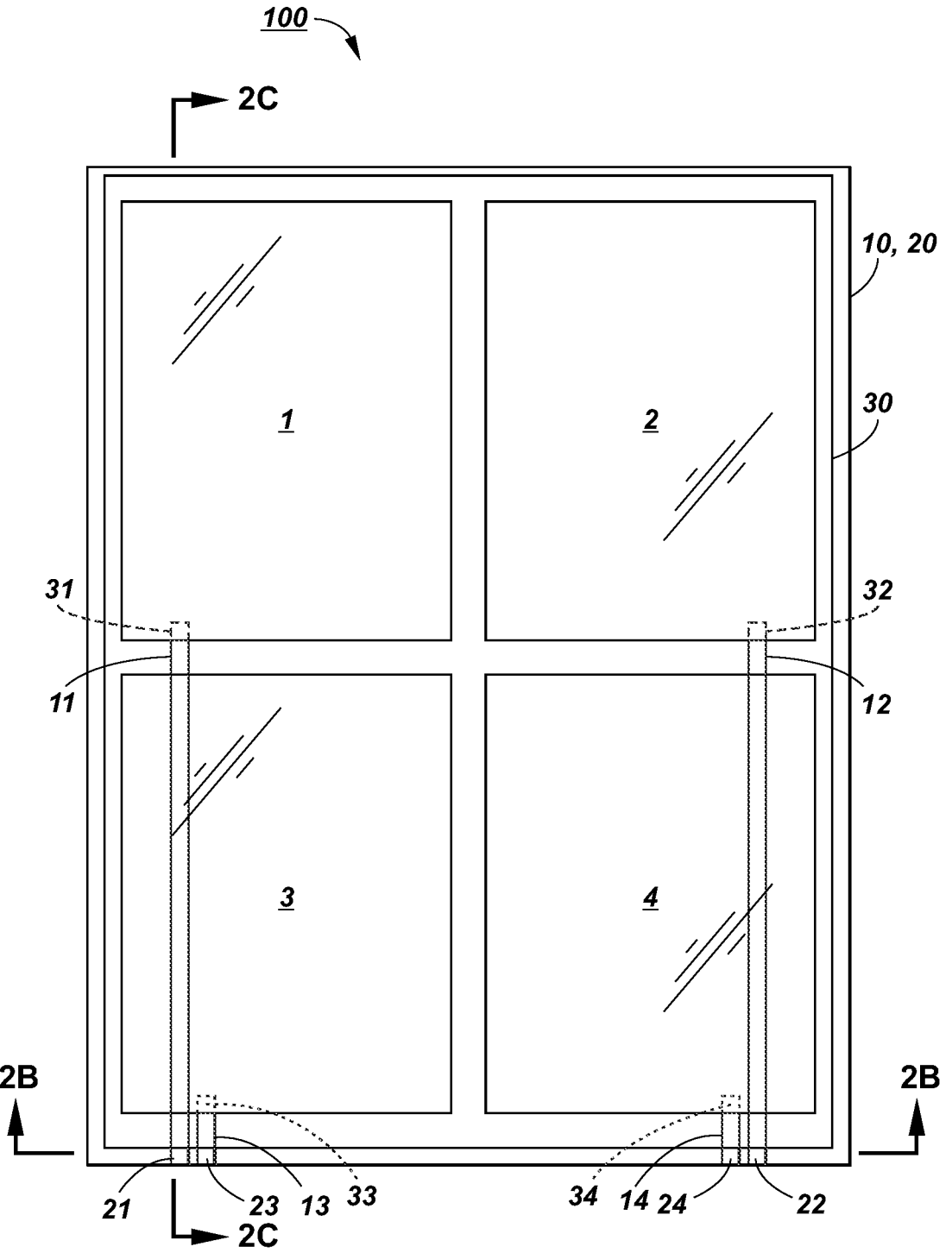
FIG. 2A is a top-view of a partial section 100 of a segmented OLED device 200.

FIG. 2A illustrates a top-view of a (partial) section 100 of a bottom-emitting segmented OLED device. In this figure, only the lower part of the overall device is shown for clarity. There are four rectangular electrode segments 1, 2, 3 and 4 in an array, each of which will eventually define an OLED segment. On top of the transparent substrate 10, there is (in order): a layer of refraction-reduction material 20 (which in this example, is the same size as the substrate), four individual power feeds 11, 12, 13 and 14, an insulation layer 30, and four segmented electrodes 1, 2, 3 and 4. Power feed 11 is electrically connected to segmented electrode 1 through a via 31 and has a contact area 21 which extends past the edge of the electrode segment 3 towards the edge of the substrate 10. Power feed 13 is electrically connected to segmented electrode 3 through a via 33 and has a contact area 23 which also extends past the edge of the electrode segment 3. Power feed 12 is electrically connected to segmented electrode 2 through a via 32 and has a contact area 22 which extends past the edge of the electrode segment 4 towards the edge of the substrate 10. Power feed 14 is electrically connected to segmented electrode 4 through a via 34 and has a contact area 24 which also extends past the edge of the electrode segment 4. All of these power feeds lie in the same plane, but are separated from each other laterally so they are not in contact. The outside power feeds 11 and 12 run underneath the electrode segments 3 and 4 while the inner power feeds 13 and 14 also run underneath but only extend just past the edge of the electrode segments 3 and 4.

Figure 2B:
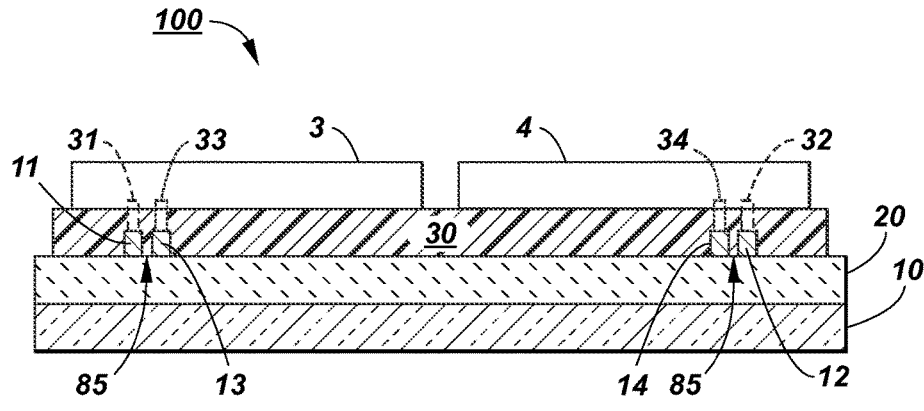
FIG. 2B shows an edge-on view of partial section 100.

FIG. 2B shows an edge-on view of lower section 100 from the edge closest to electrode segments 3 and 4 of FIG. 2A. There is (in order) the transparent substrate 10, a layer 20 of refraction-reduction material, and from left to right, the contact areas 21 (with power feed 11 directly behind), 23 (with power feed 13 directly behind) and on the other side, contact area 24 (with power feed 14 directly behind) and contact area 22 (with power feed 12 directly behind). The bottom surface of the power feeds 11, 13, 14 and 12 are in direct contact with the upper surface of layer 20 of the refraction-reduction material. Over the power feeds 11, 13, 14 and 12 is a transparent insulating layer 30 and electrode segments 3 (with 1 directly behind) and 4 (with 2 directly behind). Vias 31, 33, 34 and 32 in the insulating layer 30 allow for electrical connection between power feed 11 and electrode segment 1, 13 and 3, 14 and 4 and 12 and 2, respectively. There is a gap or space between the electrode segments 3 and 4 as well as 1 and 2 (not visible). In FIG. 2B, all of the power feeds 11, 13, 14, 12 are located in the same relative plane and are laterally separated and electrically insulated from each other by insulating layer 30 in gaps 85.

Figure 2C:
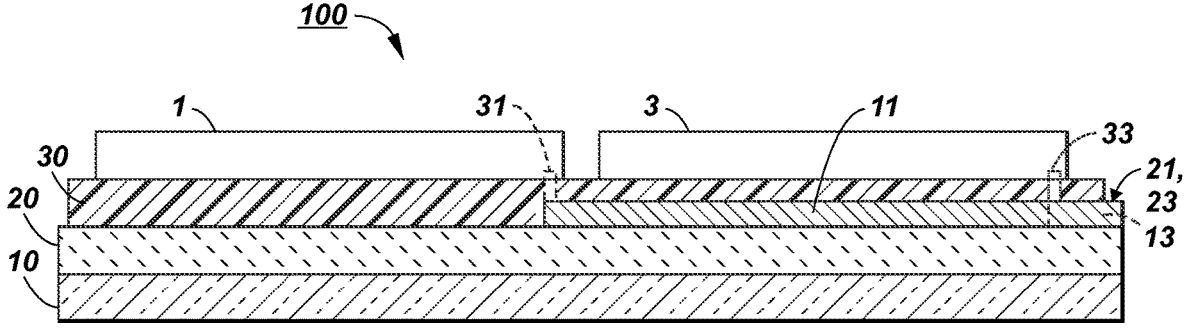
FIG. 2C shows another edge-on view of partial section 100.

FIG. 2C shows an edge-on view of lower section 100 from the left side (that is, closest to electrode segments 1 and 3) of FIG. 2A. There is (in order) the transparent substrate 10, a layer 20 of the refraction-reduction material, and the longer power feed 11 directly in front of shorter power feed 13. Longer power feed 12 and shorter power feed 14 are directly behind on the far side of the device and so are not visible in this view. The power leads 11 and 13 both extend past the edge of the electrode segment 3 to form contact areas 21 and 23 (not visible). Also, not visible are the corresponding contact areas 24 and 22 formed by power leads 14 and 12 extending past the edge of the electrode segment 4 (not visible). There is a gap between the electrode segments 1 and 3 as well as 2 and 4. This view also clearly shows that the outside power feeds 11 and 12 run underneath on the side of the electrode segments 3 and 4 while the inner power feeds 13 and 14 also run underneath but only extend just past the edge of the electrode segments 3 and 4.

Figure 3A:
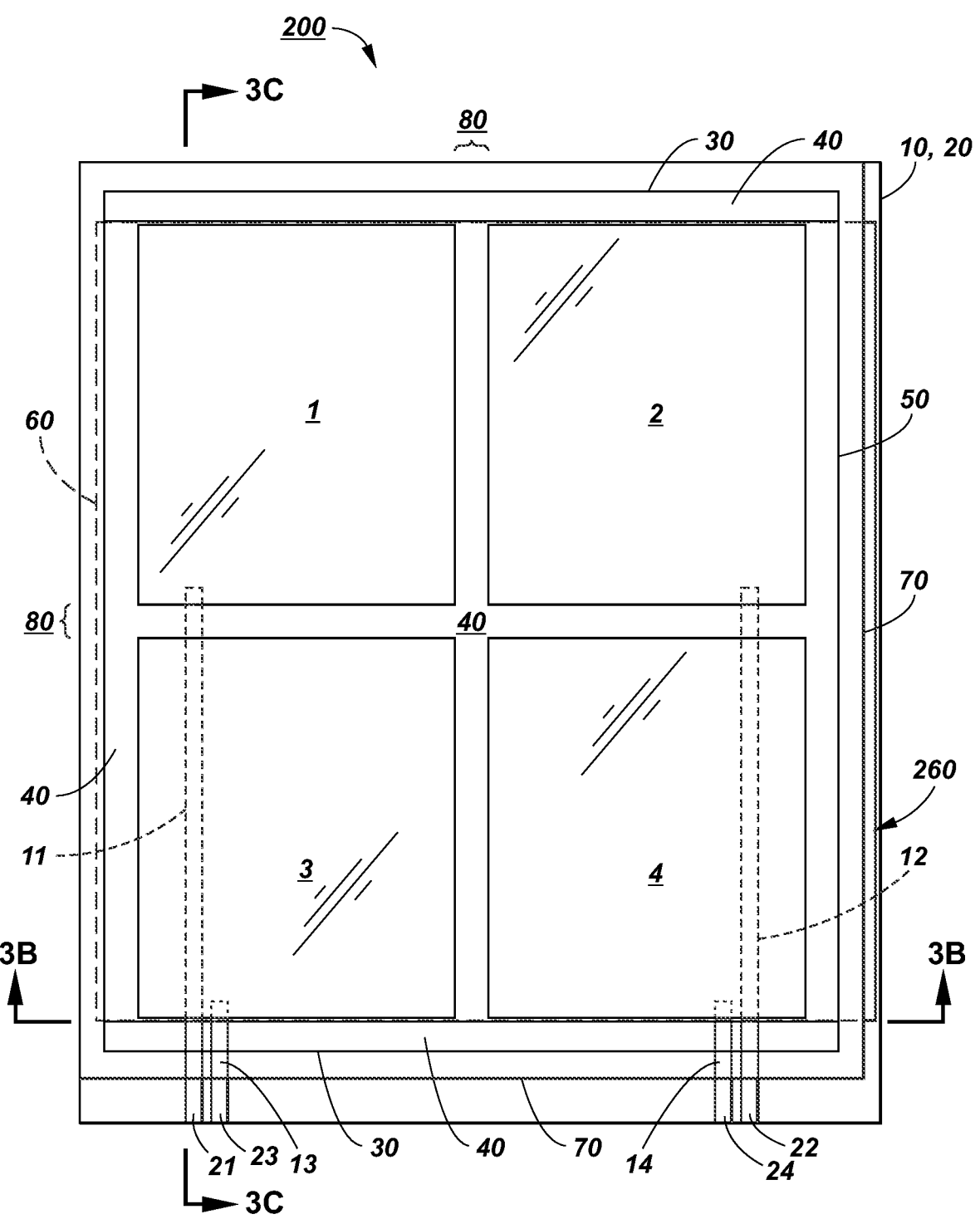
FIG. 3A shows a top-view of a complete segmented OLED device 200 according to the invention.

FIG. 3A illustrates a top-view of an entire bottom-emitting segmented OLED device 200, including the partial bottom section 100 shown in FIG. 2A. Starting with 100 (see FIG. 2A), a pixel definition layer (PDL) 40 is present in the gaps between the electrode segments 1, 2, 3 and 4 as well as along the outside edges. Over the PDL 40 and electrode segments 1, 2, 3 and 4 are OLED layers 50 for light emission as well as a top electrode 60. Along one edge, there is an extension of the top electrode 60 to the edge of the substrate 10 to form a contact area 260. Over the top electrode 60 is encapsulation 70, leaving the bottom electrode contact areas 21, 23, 24, 22 and top electrode contact area 260 exposed. In 200, the PDL fills the gaps separating the electrodes 1, 2, 3 and 4 so there is no electrical contact between them as well as protects the side of the electrode segments from contact with the top electrode 60. There is no emission from the area over the PDL 40. This results in a non-emitting gap 80 between emission areas 75. Moreover, even though power feeds 11 and 12 run underneath the electrode segments 3 and 4, there is no electrical contact because they are separated by insulating layer 30. Note that power feeds 11 and 12 lie directly in the light path of the emission through electrode segments 3 and 4.

Figure 3B:
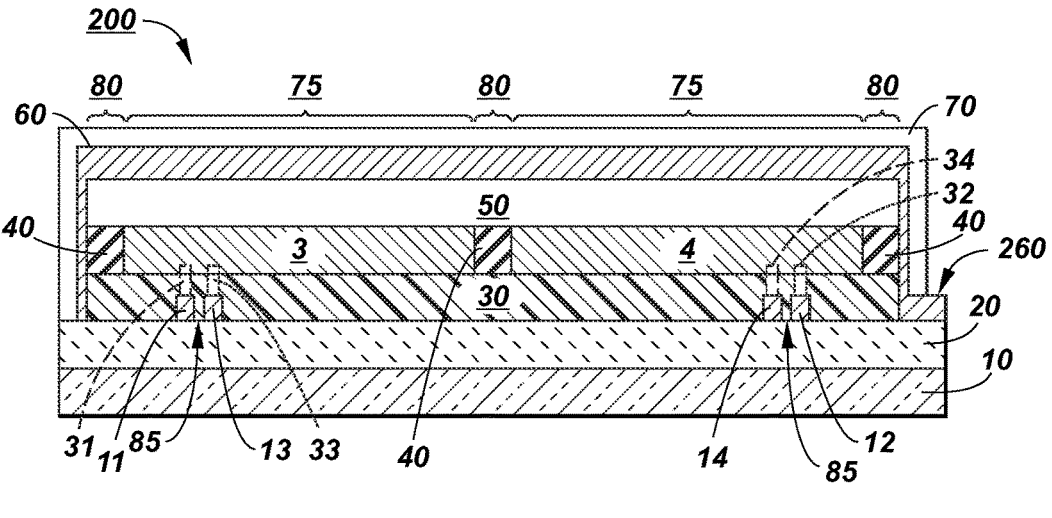
FIG. 3B shows an edge-on view of 200.

FIG. 3B shows an edge-on view of OLED device 200 from the bottom (that is, closest to electrode segments 3 and 4) of FIG. 3A. Starting with bottom section 100 (see FIG. 2B), a pixel definition layer (PDL) 40 is present in the gaps between the electrode segments 3 and 4 (1 and 2 are directly behind) as well as along the outside edges. Over the PDL 40 and electrode segments 1, 2, 3 and 4 are OLED layers 50 for light emission as well a top electrode 60. Along one edge, there is an extension of the top electrode 60 to the edge of the substrate 10 to form a contact area 260. Over the top electrode 60 is encapsulation 70, leaving the bottom electrode contact areas 21, 23, 24, 22 and top electrode contact area 260 exposed. In 200, the PDL fills the gaps separating the electrodes 1, 2, 3 and 4 so there is no electrical contact between them as well as protects the side of the electrode segments from contact with the top electrode 60.

Figure 3C:
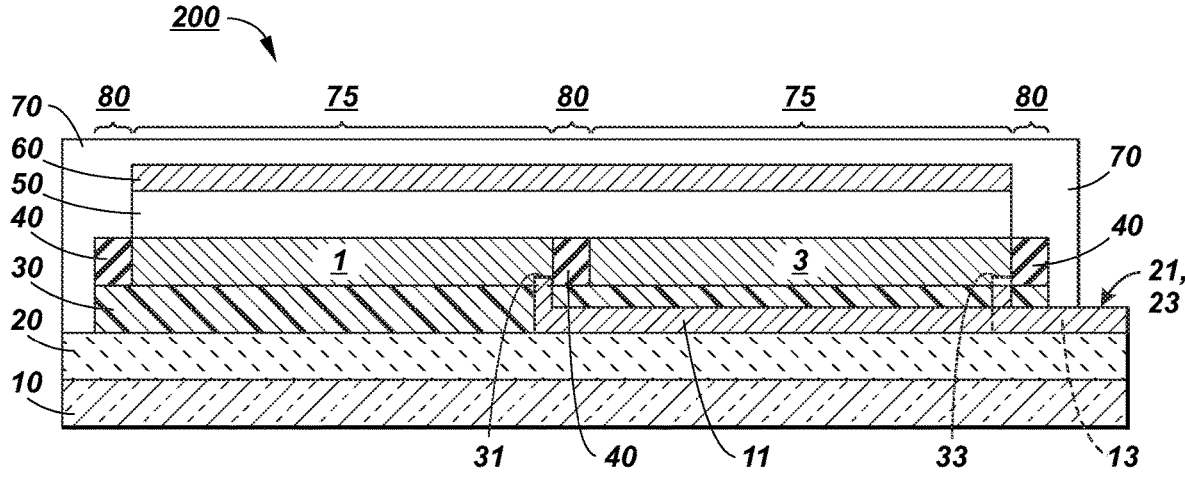
FIG. 3C shows another edge-on view of 200.

FIG. 3C shows an edge-on view of OLED device 200 from the left side (that is, closest to electrode segments 1 and 3) of FIG. 3A. Starting with bottom section 100 (see FIG. 2C), a pixel definition layer (PDL) 40 is present in the gaps between the electrode segments 1 and 3 (2 and 4 are directly behind) as well as along the outside edges. Over the electrode segments 1, 2, 3 and 4 are OLED layers 50 for light emission as well a top electrode 60. Along one edge, there are extensions of the power feeds 11, 12, 13 and 14 to the edge of the substrate 10 to form contact areas 21, 23, 24, and 22. Over the top electrode 60 is encapsulation 70, leaving the bottom electrode contact areas 21, 23, 24, 22 and top electrode contact area 260 (not visible) exposed. In this view, it can be clearly seen that even though power feeds 11 and 12 runs underneath the electrode segments 3 and 4, there is no electrical contact between them because they are separated by insulating layer 30 along their entire length.

In 200, the individual OLED segments that form the array correspond to its bottom segmented electrode. However, the emission area 75 of the OLED segment may not exactly correspond to the size of electrode segment and there may be some portions of the OLED segment over the electrode segment that are non-emitting. For example, some portion of the PDL can be patterned to overlap a portion of the upper surface of the electrode segment to prevent light generation from the covered portions. When power is supplied to one of the contact areas (for example, 21), it passes through the power feed (i.e., 11 under the electrode segment 3) to the appropriate electrode segment (i.e., 1) through a via (i.e., 31) in the insulating layer 30. At that time, the power causes light emission in the OLED layers 50 in the region above the electrode segments. Since the OLED segments are bottom-emitting, the emitted light passes through the transparent electrode segments, the insulating layer (if present), any power feeds lying directly under the electrode segment, the refraction-reduction material and the transparent substrate. The emission areas 75, corresponding to the bottom segmented electrode, are separated by the non-emitting gaps 80 between the segments as well as along the outside edges of the device. The non-emitting gaps 80 may partially overlap the electrode segments.

Generally speaking, the conductive material from which the power feed is composed has a relatively high refractive index while the surrounding materials can have a different, often substantially lower, refraction. This difference in refractive index at the interface between the power feed and insulating layer can lead to a visible difference in emission compared to areas without the power feed; see FIG. 1. By incorporating a refraction-reduction material in the segmented OLED device where the index of refraction of the refraction-reduction material is more similar in magnitude to the refraction index of the power feeds, any visible difference in emission due the presence of the power feeds in the light pathway can be eliminated or at least reduced.

In FIGS. 3A-3C, the layer 20 of refraction-reduction material is shown as a continuous layer directly underneath the bottom surface of the power feeds 11, 12, 13 and 14. As shown, layer 20 is the same size and completely covers the transparent substrate 10. However, layer 20 can be patterned so that it is smaller than the transparent substrate 10 and in particular, only present within the encapsulated area of the segmented OLED. Alternatively, the refraction-reduction material may be patterned so that it is only present directly under the power feeds. In this case, the lateral spaces between the refraction-reduction material and the overlying power feed can be filled with an insulating and transparent material.

In 200, the power feeds are patterned on the upper surface of layer 20 of refraction-reduction material so that only the bottom side of the power feed is in direct contact with refractive-reduction material. While this is easy and simple to manufacture, it may not provide a sufficient reduction in visibility in all cases.

Figure 4:
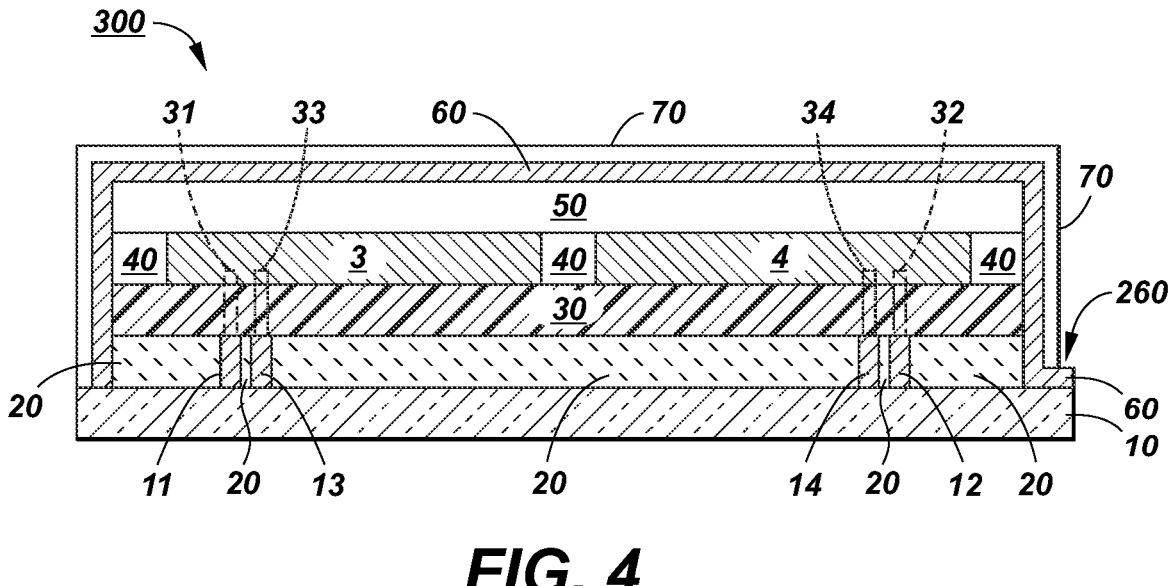
FIG. 4 shows a cross-section of an inventive segmented OLED device 300.

FIG. 4 shows an embodiment 300 of an OLED device where the power leads 11, 13, 14 and 12 are located directly on the transparent substrate 10 with the lateral spaces between them filled with a refraction-reduction material 20. In particular, the gaps or spaces between power feeds 11, 13, 14 and 12 are not filled with insulating layer 30 as in device 200 but instead with a refraction-reduction material 20. In this way, the refraction-reduction material 20 is adjacent to the side (vertical) walls of the power leads and helps to reduce the visibility due to differences in refractive index. The thickness of 20 is adjusted so that it is no higher than the upper surface of any of the power leads. In this way, it does not interfere with the creation of the vias 31, 33, 34 and 32 in the insulting layer 30 which lies over the top of the power leads/refraction-reduction material. The refraction-reduction material 20 may be the same as or different in each of the lateral spaces between the power feeds. In 300 the refraction-reduction material is in direct contact with the vertical surfaces of the power feeds.

Figure 5:
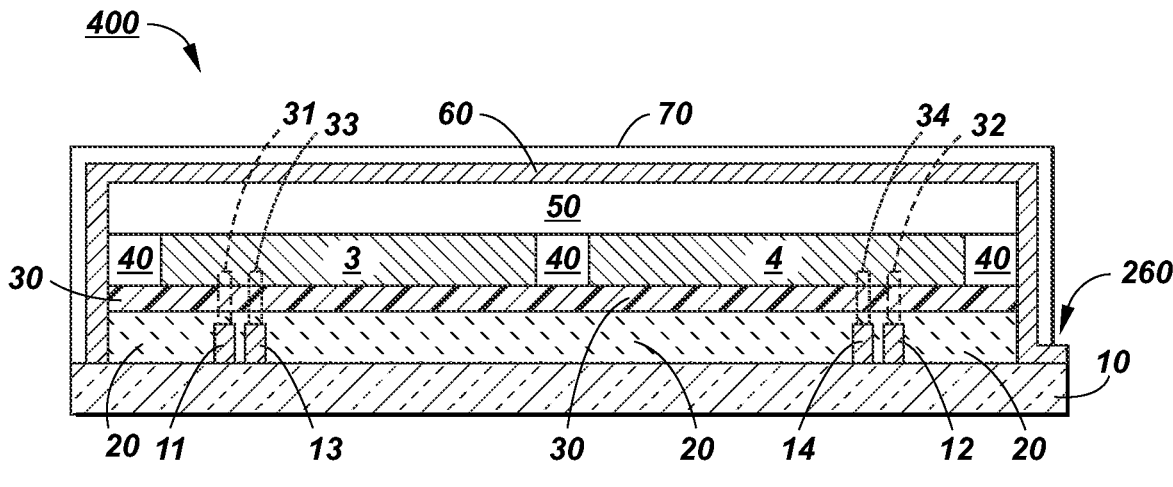
FIG. 5 shows a cross-section of an inventive segmented OLED device 400.

FIG. 5 shows an embodiment 400 of an OLED device which is the same as shown in FIG. 4 except that that the height (above the substrate 10) of the layer 20 of refraction-reduction material is greater than the height of the power feeds 11, 13, 14 and 12. In this embodiment, all of the lateral gaps between the power feeds are filled with refraction-reduction layer 20. The overlying insulating layer 30 is still present between the upper surface of the refraction-reduction layer 20 and the lower surface of the electrode segment. In this embodiment, the vias 31, 33, 34 and 32 extend through both the insulating layer and the refraction-reduction layer 20. The presence of the refraction-reduction material in direct contact with three sides (top and two vertical surfaces) of the power feeds provides a further reduction in visibility of the power feeds.

Figure 6:
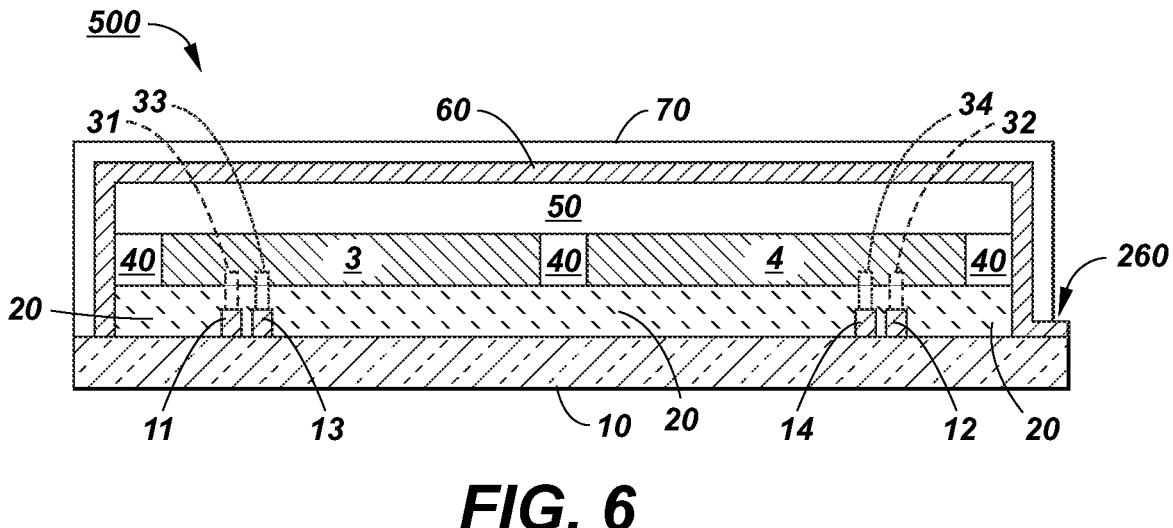
FIG. 6 shows a cross-section of an inventive segmented OLED device 500.

FIG. 6 shows an embodiment 500 of an OLED device which is the same as shown in FIG. 5 except that the insulating layer 30 has been replaced entirely by the refraction-reduction layer 20. The entire vertical distance between the upper surface of transparent substrate 10 on which the power feeds are located and the lower surface of the electrode segments is filled with refraction-reduction layer 20. In this embodiment, the vias 31, 33, 34 and 32 extend through the refraction-reduction layer 20.

Figure 7:
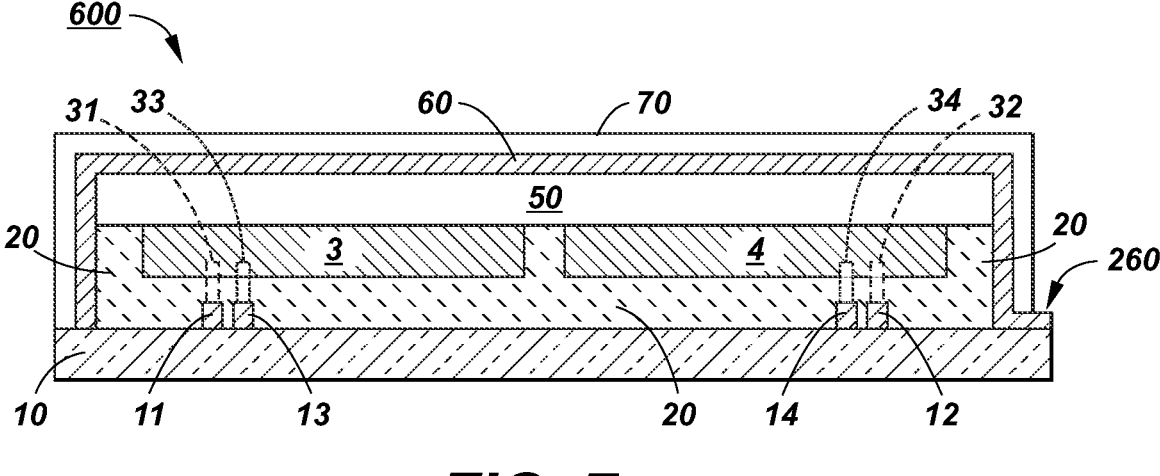
FIG. 7 shows a cross-section of an inventive segmented OLED device 600.

FIG. 7 shows an embodiment 600 of an OLED device which is the same as shown in FIG. 6 except that the PDL layer 40 has been replaced entirely by the refraction-reduction layer 20. In 600, there is no PDL. As shown, the gaps between the electrode segments and the outside are filled with refraction-reduction material as layer 20. The refraction-reduction layer 20 may be patterned to form wells in which the electrode segments are then formed. Alternatively, the electrode segments can be patterned on top of a uniform refraction-reduction layer 20 and then additional refraction-reduction material added and patterned to fill the gaps and edges.

Figure 8:
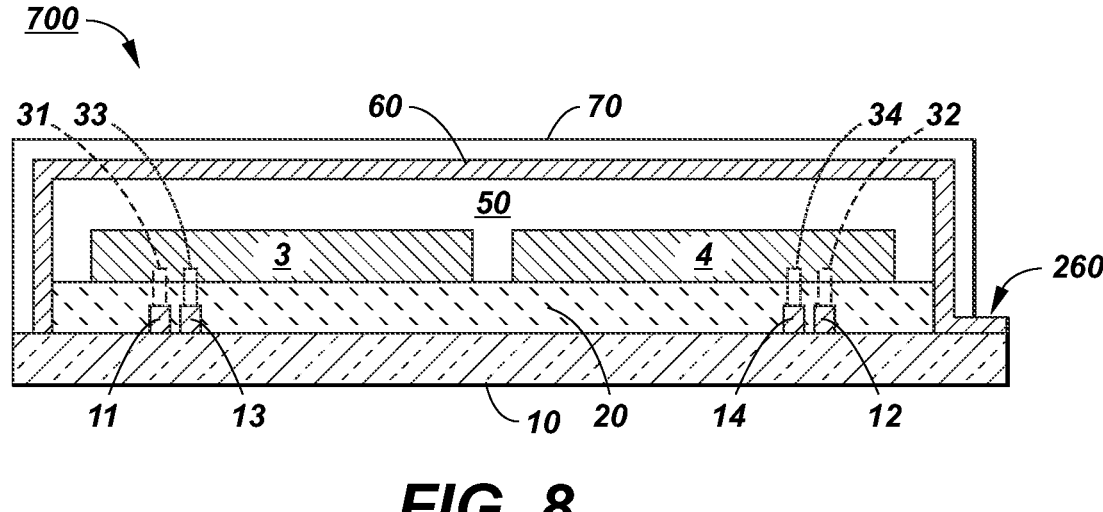
FIG. 8 shows a cross-section of an inventive segmented OLED device 700.

FIG. 8 shows an embodiment 700 of an OLED device similar to 600 except that the electrode segments are patterned directly over the refraction-reduction layer 20 and the organic layers 50 are formed directly over the electrode segments. In this case, the organic material for light-emission fills the gaps between the electrode segments. There will be some emission (cross-talk) from the organic layers located within the gap between the segments whenever one of the electrode segments is activated. While emission from the gaps between the segments can be undesirable in some applications, it may not matter or be a concern in others, particularly monochromatic devices which are not expected or required to have clear definition and separation of the individual segments.

As shown in 700, there will also be emission along the outside edges of the segmented electrodes since there are organic emission layers 50 between the top electrode 60 and the edge of the segmented electrodes in this area. This may not be a problem or concern in some applications since the device is bottom-emitting and the sides will be generally encapsulated or covered with opaque materials. If this is problematic, the organic layers 50 along the outer edges of the device can be patterned so they are not present in this area or can be removed after deposition; for example, by laser ablation. However, in order to protect shorting between the top electrode 60 and the electrode segment, it will be necessary to either pattern the top electrode 60 so that it does not extend past the outside edge of the organic layers 50 over the electrode segment, or the space where the organic layers 50 were removed refilled with an insulating material such as a PDL.

In any of the embodiments shown in FIGS. 4-8 where the refraction-reduction material is present in the lateral spaces between the power feeds or between the power feed and a bottom electrode segment, it is important that the refraction-reduction material be electrically non-conducting (insulating). It is necessary that the refraction-reduction material 20 be sufficiently non-conductive so that there are no electrical short-circuits between the power feeds or between the power feeds and bottom electrode segments.

In any of the embodiments shown in FIGS. 4-8 (devices 300-700), an additional layer of refraction-reduction material 20 (as in FIGS. 3A-3C of 200) may be present between the power feeds and the transparent substrate 10 if desired. The presence of a layer of refraction-reduction material below the power feeds as well as on the sides and/or top can provide an even further reduction in visibility.

In the embodiments shown in FIGS. 3-8, the OLED layers 50 extend uniformly across all electrode segments and the gaps between them and are common to all of the individual OLED segments. This is desirable in applications where all of the individual OLED segments have the same emission since it reduces manufacturing complexity.

However, having common OLED layers may lead to some degree of cross-talk even when the electrode segments are electrically separated (i.e., by PDL 40 in FIG. 3B). Cross-talk is where the emitted luminance provided by one segment is unintentionally affected by another segment. This is undesirable because the segment affected no longer provides the exact luminance intended and so, depending on the application, the overall quality of the device emission can be degraded. It is often desirable that the amount of cross-talk between pixels be 25% or less, and preferably 10% or less. The amount of cross-talk observed is dependent on many factors, including the size of the segments, the width of the gaps between them, the thickness of the light-emitting OLED layers and whether the OLED layers are part of a microcavity.

Cross-talk can occur by both optical and chemical/electrical mechanisms. Some optical processes that can increase the amount of cross-talk include light-scattering and waveguiding within the OLED device. Some chemical/electrical processes that can increase cross-talk include lateral carrier migration through one or more of the common OLED layers from one electrode segment to a neighboring non-active segment. There are known ways to reduce or mitigate cross-talk that may be applicable if the amount of observed cross-talk is a problem for a particular application.

One way to reduce cross-talk is to avoid the use of common OLED layers across multiple electrode segments. As for the segmented electrodes which must be kept electrically isolated from each other, the OLED layers can be divided by a pixel definition layer into segments that correspond to an individual electrode segment.

Figure 9:
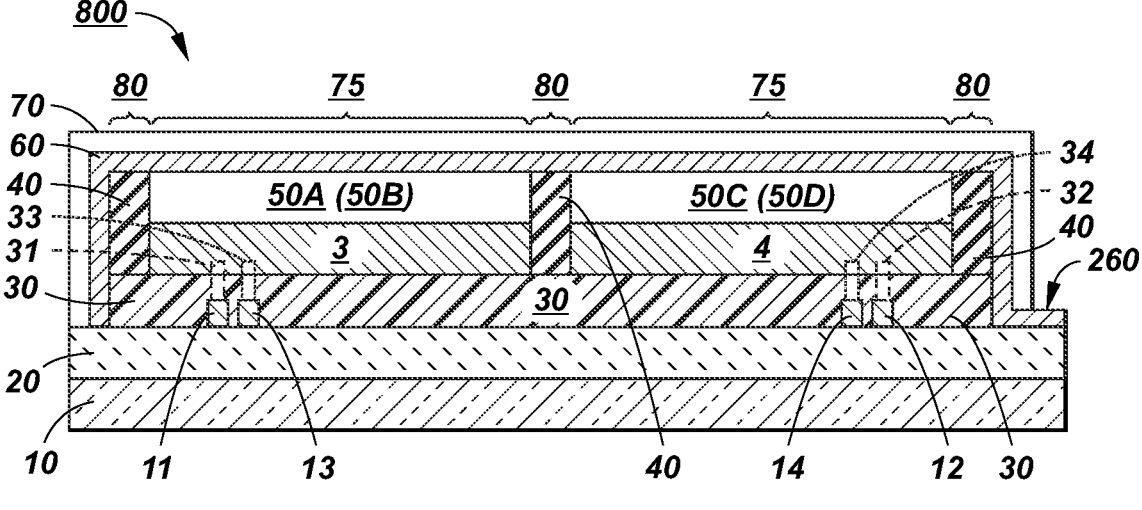
FIG. 9 shows a cross-section of an inventive segmented OLED device 800.

FIG. 9 shows an OLED device 800 where the OLED layers over each electrode segment are separated by a pixel definition layer within the gap between electrode segments. In this embodiment, the refraction-reduction layer (20) is located between the bottom side of the power feeds (11, 12, 13, 14) and the transparent substrate (10) with an insulating layer (30) located over and between the power feeds (11, 12, 13, 14) and under the electrode segments (1, 2, 3, 4). Device 800 is like 200 (see FIG. 3B) except that the PDL 40 has been extended above the upper surface of the electrode segments both in-between the electrode segments as well as along the outside edges. The walls created by the extended height of the PDL 40 creates a well that contains the OLED layers. In particular, the increased height of PDL 40 along all sides of the electrode segments 3 (with segment 1 directly behind) and 4 (with segment 2 directly behind) creates an OLED segment 50A over 3 (with OLED segment 50B over 1 directly behind) and OLED segment 50C over 4 (with OLED segment 50D over 2 directly behind). Since there is no common layer (except for a common top electrode 60 as shown) between the OLED segments, cross-talk can be greatly reduced. It is possible that the PDL layer 40 be patterned so that it not only fills the space between the electrode segments but also partially overlaps the edges of the electrode segment which will result in a smaller emission area with a larger gap between segments.

The use of the extended PDL layer to define the segments as shown in 800 can be combined with the various arrangements of the power feeds/refraction-reduction material/insulating layer as shown in FIGS. 3-8 as well.

It should be noted that there are two general methods to create an OLED device in which some segments produce different color emission than other segments. One method uses OLED segments that directly emit the desired color. The embodiment shown in FIG. 9 is useful for such applications. Alternatively, all OLED segments can emit white or multimodal light and color filters used to create the desired color of emission of each particular segment.

The transparent substrate 10 can be glass (including flexible glass) or polymeric materials. Generally speaking, it will be flat with a uniform thickness. The top surface of the substrate is that facing the OLED. Since the substrate will be part of the overall encapsulation for the OLED, it should be sufficiently impervious to air and water so that the OLED will have desired lifetime. The substrate can be rigid or flexible. The substrate may have various types of subbing layers (i.e., planarization layers, light management layers, etc.) which may be patterned or unpatterned and can be located either on the top or bottom surfaces. Rigid or flexible glass is preferred.

There should be only one power feed per segment. In some instances, the power feed may be split into two or more sub-feeds which are connected in different locations to the same electrode segment. In some cases, two or more separate but commonly operated power feeds (considered to be equivalent to a single power feed) may be connected to a single segment. For example, a driver with maximum output of 10 mA connects to a 20 cm$^2$ segment. If the segment needs 1 mA/cm$^2$ to produce the desired light output, then this segment would need 2 power feeds (one from each driver or one each from 2 channels of a multi-channel driver). Such arrangements can help distribute the power more uniformly over the segment or reduce IR drop. However, in some instances, the same power feed can be used for two or more segments. Segments that share a common power feed cannot be activated independently and will emit in common are considered as being equivalent to a single segment.

There is an external contact area (also referred to as a contact pad) outside of the encapsulation that is electrically connected to each of the power feeds that are within the encapsulation. Although the Figures show an extension of the power feeds outside of the encapsulation that forms the contact areas, e.g., 21-24, it is also possible to selectively remove encapsulation over the power feeds to make electrical contact through the encapsulation. Controlled power sources are then electrically connected (i.e., by soldering or ACF) to these contact areas to supply power as necessary to the power feeds and segmented electrode within the encapsulation. Delivering the appropriate amount of power to the contact areas over a suitable period of time will cause the OLED segment to emit light at the desired luminance for that period of time. The power delivered to the external contact pads is determined by a controller or driver.

The location and distribution of the individual power feeds across the surface of the substrate will depend on the design of the segment array. Some power feeds may be located along non-emitting areas (i.e., under the gaps and/or outside edge of the device) while others are located under the segments and in the light path. Depending on the design, some segments may not have not any power feeds located below them while other segments have multiple power feeds. The inclusion of the refraction-reduction material helps make the emission from each segment in the device appear more uniform.

It is important that the IR drop along the power feeds be similar for all OLED segments without regard to the distance from the external power source or the size of the OLED segment (larger segments require more power for operation than smaller segments). However, IR drop can be minimized by adjusting the width (parallel to the substrate) or height (above the substrate) of the power feed. Thus, in such cases, not all of the power feeds will have the same width and height dimensions, which can vary as a function of their length as well. Moreover, not all of the power feeds may have the same construction. For example, shorter power feeds may be made of a conductive metal oxide but longer power feeds may have an auxiliary electrode or be made of metal like a thin layer of Ag.

Ideally, the power feeds are as transparent as possible. The power feeds may be composed of any electrically conductive material that can be patterned. For example, the power feeds may be made of metal such as silver or copper, conductive metal oxides such as ITO, AZO, IZO, GZO, ZnO, TiN or SnO$_2$, organic materials such as PEDOT:PSS, CNTs (carbon nanotubes), graphene or conductive particles such as silver, nickel or copper suspended in a polymeric binder (conductive inks) or any combination of these materials. Conductive materials that are inherently opaque (i.e., silver) can be in the form of nanowires or mesh so there are openings within the structure of the power feeds that allow some light to pass or may be thin enough to not be opaque. Ideally, the power feeds should have a resistivity of less than 25 ohms/square and desirably less than of 15 ohm/square.

Desirably, the power feeds are composed of a conductive metal oxide with ITO being particularly preferred. However, ITO is known to have a limited degree of lateral electrical conduction. If necessary, power feeds formed of a conductive metal oxide can have an auxiliary electrode (for example, an overcoat or sublayer of a conductive metal such as metallic silver or aluminum, or a conductive metallic mesh) to help minimize IR drop for part or all of its length When located in the emission light path of the segmented OLED device, the power feeds may be visible because they may have refraction index $(R_I)$ that is different from the surrounding materials. In optics, the refractive index (also known as index of refraction) of a material is a dimensionless number (n) that describes how fast light travels through the material. It is defined as n=c/v where c is the speed of light in vacuum and v is the phase velocity of light in the medium. The refractive index determines how much the path of light is bent, or refracted, when entering a material and can be described by Snell's law of refraction. When there is an interface between two materials, the relative difference in the refractive indices will determine the amount of light refracted. The relative refractive indices also determine the amount of light that is reflected when reaching the interface, as well as the critical angle for total internal reflection. The larger the difference in $R_I$ between two materials in contact, the greater of the amount of light refraction and so, the interface between the materials will become more visible. The closer the $R_I$ of the two materials, light is refracted less and so, the interface becomes less noticeable. Note that only the difference in $R_I$ is important; it does not matter which material is higher and which is lower. It should be noted that the $R_I$ of any material is dependent on the wavelength of light.

The following tables list typical $R_I$ values for a selection of materials commonly used in OLED devices:

| Inorganic Materials | | | | | |
|---|---|---|---|---|---|
| Material | $R_1$ | Material | $R_1$ | Material | $R_1$ |
| TiN | 1.289 | Si₃N₄ | 2.046 | Nb₂O₅ | 2.340 |
| SiO₂ | 1.473 | TiO₂ | 2.614 | SiN | 1.904 |
| ITO | 1.827 | AZO | 1.9 | SnO₂ | 2.0 |
| Crown Glass | 1.17 | Flint Glass | 1.655 | Flexible glass | 1.52 |
| Polysiloxanes | 1.40 | | | | |

| Organic Materials | | | |
|---|---|---|---|
| Material | $R_1$ | Material | $R_1$ |
| PET Polymer | 1.62-1.68 | Acrylic Polymer | 1.48-1.50 |
| Polycarbonate | 1.56 | Polystyrene | 1.60 |
| PNMA | 1.49 | Graphene | 2.41 |
| PEDOT:PSS | 1.2-1.6 | CNT | 2.5 |
| Polyimides | 1.50 | Conductive Inks | 1.5-1.6 |

It is important to note that the $R_I$ values given above are only typical and the actual $R_I$ of any of these materials will depend on their exact composition and method of preparation, whether present as a thin film or in bulk, and the wavelength of light. However, methods for the measurement of actual $R_I$ values of materials are well-known.

In some cases, the power feeds can be made of materials or a mixture of materials which may not have a readily discernable single $R_I$ value. It such cases, it may be necessary to determine an effective $R_I$ value by experimental determination or calculation. Calculation methods may be used for a mixture of materials with known $R_I$. As another example, metals may be used as power feeds in the form of thin layers which are at least semi-transparent. In this usage, an effective $R_I$ value may be experimentally determined or calculated. Likewise, an effective $R_I$ value may be determined for applications where there are openings within the structure of the power feeds that allow some light to pass. Another example are conductive inks which are suspensions of conductive particles in a binder. They are deposited and then the binder cured or partially removed to form the power line as a thin film whose effective $R_I$ can be measured. Even if one or both of the effective $R_I$ of the materials are undetermined or unknown, it is possible to determine the relative $R_I$ by simple optical measurements when light passes through the interface. If the $R_I$ are relatively matched, there will little refraction; as the difference becomes larger, the amount of refraction increases.

As one example, the use of ITO $(R_I=1.8)$ power feeds directly over a substrate made of glass $(R_I=1.5)$ or PET $(R_I=1.6)$ clearly leads to a mismatch in $R_I$ between the ITO and the substrate that is larger than the mismatch in $R_I$ between the materials in the gap between the power feeds (typically a polymer with $R_I$ between 1.4-1.6) and the substrate. Light will be refracted at the ITO/substrate interface differently than at the polymer/substrate interface and so the power feeds will be visible. By reducing the $R_I$ mismatches at the interfaces at the top, bottom and sides of the power feeds and the surrounding materials, the power feeds will become less visible.

Desirable refraction-reduction materials and layers thereof are those that can be formed and patterned as thin-films. In many embodiments, the refraction-reduction layer or material should match the $R_I$ of the material of the power feed as closely as possible, although an exact match is not required. Ideally, the mismatch (ratio of high $R_I$/low $R_I$) between the material with the higher $R_I$ and the material with the lower $R_I$ should be in the range of 1.00 to 1.06, or preferably in the range of 1.00 to 1.03. It is not important which material is higher and which is lower. The refraction-reduction layer or material must be a solid as used in the device; liquids or oils are not suitable.

The refraction-reduction material and layers thereof must be as transparent as possible. Desirably, it has a transmissivity of 90% or better. The refraction-reduction material should not scatter light. If the refraction-reduction material contains particles, the particles themselves should be sufficiently small so that light is not scattered. The maximum amount of light scatter due to the refraction-reduction layer or materials should be no more than 10% (measured in-line where the source light is perpendicular to the refraction-reduction layer or materials and compared to the total light measured in an integrating sphere.

For many applications, it is important that the refraction-reduction material and layers thereof are electrically non-conductive. When the refraction-reduction material is in direct contact with the electrically conductive power feeds, having the layer in direct contact be electrically insulating will prevent internal shorting between the power feeds and between the power leads and the overlying electrode segments. For this reason, the refraction-reduction layer should have an electrical resistance of no less than 1 Mohm (MΩ) and more preferably, no less than 2 Mohms.

It is well known that the $R_I$ of polymers can be adjusted by the use of appropriate functional groups or structural components within the polymer backbone or incorporating other polymers. Moreover, it is also well known that suspensions of high $R_I$ inorganic or organic particles in a lower $R_I$ polymeric binder can be used as refraction-reduction layers since the effective $R_I$ can be easily adjusted by the concentration of the high $R_I$ particles. These $R_I$ adjustable polymers may have some amount of removable solvent to control viscosity and/or control stability of the suspensions. Since such polymeric solutions are generally viscous liquid, they can be easily applied as thin-films using known techniques such as spin or slot coating or can be patterned by application by ink-jet and similar techniques or using photolithographic techniques. Once applied, they may need to be cured by UV-radiation, heat treatment and/or removal of solvent in order to solidify them.

Suitable examples of polymer-based refraction-reduction layers or materials are: nanoparticles such as nano-zirconia in a polymer matrix or a single or mixture of organic materials such as siloxanes with high molecular weight organic functional groups.

In some cases, refraction-reduction polymers may contain some amount of water or oxygen. Even trace amounts can be deleterious to the OLED materials since the refraction-reduction materials will be contained within the encapsulation of the device. Thus, it may be necessary to bake or apply a heat-treatment, which may be performed in a vacuum, the device after depositing the refraction-reduction polymer but before the organic OLED materials are deposited. If the refraction-reduction polymer is deposited in multiple steps, the heat treatment may occur after each step or after all the steps are completed. A suitable heat treatment would be to maintain the device at 200 deg C. for at least 0.5 hours in an oven.

Because heat treatment may have adverse effects on other parts of the device and because it increases the total time of manufacture, it is preferred to use inorganic materials as the refraction-reduction material or layer. Inorganic materials are typically deposited under vacuum deposition conditions or by CVD (chemical vapor deposition) so that water or oxygen contamination is not a concern and the device can be immediately subjected to the next step in its manufacture. If necessary, they can be patterned using known shadow masking or photolithographic techniques.

In order to adjust or control the $R_I$ of the inorganic refraction-reduction materials if may be desirable to co-deposit two or more different inorganic materials, each with a different $R_I$, at a specific ratio to adjust the effective $R_I$ of the mixture to match the $R_I$ of the power feeds.

Suitable inorganic refraction-reduction layers or materials include metal oxides or nitrides such as zirconia, niobium oxides, titanium dioxide, silicon nitride, etc. and mixtures thereof. In particular, a mixture of $Nb_2O_5$ ($R_I$=2.34) and $SiO_2$ ($R_I$=1.47) can be used to match the $R_I$ of ITO ($R_I$=1.82). This mixture is transparent and non-electrically conductive.

A refraction-reduction layer may be divided into two or more separate layers. Each layer may be composed of different materials if desired.

Although it is desirable that the refraction-reduction material may be in direct contact with the power feeds, this is not strictly necessary in all cases. However, it is necessary that the refraction-reduction material at least be located between the bottom surface of the bottom electrode segments and the top surface of the transparent substrate and within the light path of light emission. This may include the lateral spaces separating the individual power feeds that are located under the bottom electrode and in the light pathway, even if the refraction-reduction material is not in direct contact with the sides of the power feeds.

In particular, a refraction-reduction material can be located over a base layer, over the refraction-reduction material can be an intermediate material, and over the intermediate material are the power feeds. In this embodiment, the refraction-reduction material is not in direct contact with the power feeds. The intermediate material would have a $R_I$ that is between the $R_I$ of the refraction-reduction material and the $R_I$ of the transparent substrate. In this way, the refraction-reduction material reduce the refraction between the base layer and itself, and the intermediate layer reduce the refraction between the intermediate layer and the power feed. For example, visibility of the power feeds can be reduced using glass ($R_I$=1.5), as the base layer, an overcoat of a refraction-reduction material (i.e., $Nb_2O_5$/$SiO_2$) adjusted so that $R_I$=1.6, a layer of intermediate material (i.e., $Nb_2O_5$/$SiO_2$) adjusted so that $R_I$=1.7 and a power feed of ITO with $R_I$=1.8.

In many embodiments, the refraction-reduction material also provides electrical insulation to prevent short-circuits in addition to reducing the visibility of the power feeds. However, in other embodiments, there is an optional insulating layer between the power leads and the segmented electrodes. The power feeds cannot be in electrical contact with any other electrode segment except for the one it controls. Thus, an insulating layer may be necessary to prevent short-circuits between the power feed and an overlying electrode segment in addition to the refraction-reduction layer or materials.

The material of the insulating layer is different from the refraction-reduction material and the $R_I$ does not have to match the $R_I$ of the power feed. However, it should be both transparent and non-light scattering as does the refraction-reduction material. The insulating layer should have at least the same or greater resistivity as the refraction-reduction material. The insulating layer may be polymeric, but is preferably inorganic. Suitable inorganic insulating layers or materials include SiO2, SiN, SiON, $Al_2O_3$, $TiO_2$, etc. and mixtures thereof.

The vertical space between the top surface of the power feed and the bottom surface of the electrode segment should be filled with an insulating material including the refraction-reduction layer, the insulating layer or both. The vertical distance should be greater than 0.1 microns to prevent short circuits and no more than 10 microns and ideally in the range of 0.2-1.0 micron in order to maintain a thin device.

The electrical connection between the power feed and the overlying segmented electrode is made through a via, which is a hole or pathway in the insulating materials (i.e., the insulating layer, the refraction-reduction layer, or both) that separate the two. The via runs from the top of the power feed to the bottom or side of the segmented electrode. Ideally, the via connects to segmented electrode in a location corresponding to a non-emitting area of the segmented OLED. The via can be formed by patterning the overlying insulating material so as to leave at least a portion of the top surface of the power feed exposed or uncovered. Alternatively, the overlying insulating material can be uniformly deposited over the power feeds and the via created by removal of the materials over the desired section of the power feed and thus, exposing the top surface.

The via is filled with electrically conductive material. When the segmented electrode is deposited over the materials, some of the material of the segmented electrode can fill the via to make the connection. Alternatively, the via can be filled first with an electrically conductive material and then the segmented electrode is deposited over the filled via/top surface of the insulating material. In some cases, it may be necessary to treat the power feed, prior to depositing the insulating layer, or a filled via, prior to depositing the segmented electrode, with a material that promotes electrical conductivity through the connection.

The length and area of the via is not critical, but should be sufficient to supply the necessary power to the segmented electrode. The via can be of any shape along the upper surface of the power feed. In particular, it may extend along a length of the power lead. There may be more than one via between the power feed and electrode segment.

There is an array of individual electrode segments located over a common substrate along with any other intervening layers such as the refraction-reduction layer. By "common", it is meant that all OLED segments in the array share the same substrate and are manufactured together on that substrate as an array. There is a non-emitting lateral gap between the individual segments on all sides (except for the ones located along the outside edge or at the corners of the device) that separates them. A segmented OLED array is different from a tiled OLED array, where complete individual OLED segments are each manufactured separately on their own substrate and then each complete OLED segment is then mounted on a single shared substrate.

The segmented OLED device is a bottom emitter and the bottom electrode segments are transparent. The transparent electrode segment should transmit as much light as possible, preferably having a transmittance of at least 70% or more desirably at least 80%. However, in some applications (i.e., microcavity devices), the transparent bottom electrode may only be semi-transparent and have partial reflectivity. While the bottom transparent electrode may be made of any conductive materials, metal oxides such as ITO or AZO or thin layers of metals such as Ag are preferable. In some cases, there may be an auxiliary electrode to help distribute charge more uniformly across the area of the transparent electrode. Ideally, the electrode segments should have a resistivity of less than 25 ohms/square and desirably in the range of 10-23 ohm/square.

In some embodiments, there is a pixel definition layer (PDL) which separates parts of one OLED segment from another or along the outside perimeter of the array. For example, the PDL can separate the electrode segments from being in electrical contact, used to restrict organic layers to a single OLED segment or define the outside edge of the array. In some cases, it can be used to partially cover the electrode segment to prevent light-emission in the PDL areas (for example, in areas where the via is located along the edge of the electrode segment). In other cases where there is no PDL layer in the gap between the electrode segments (i.e., see FIGS. 7 and 8), there still may PDL located along the outside perimeter of the array. The PDL should be insulating (electrically non-conductive).

In some embodiments, the PDL in the gap between the electrode segments will have approximately the same thickness as the electrode segments. This will create a relatively flat surface for depositing the overlying layers (i.e., see FIG. 3B). In other embodiments, the PDL will be thicker than the electrode segments and so a section of the PDL will extend past the upper surface of the electrode segment (i.e., see FIG. 9), either in the gaps or along the outside edge of the array. In some case the extended portion of the PDL will also cover some part of the upper surface of the electrode surface. In such cases, the PDL may cause light piping or light guiding which would be undesired. To reduce light piping, absorbing dyes may be added to the PDL Alternatively, the PDL layer material may be opaque or black.

Suitable PDL materials may be polymeric or inorganic. Some examples of a suitable polymeric PDL include acrylic and polyimide polymers. Some examples of a suitable inorganic PDL include $SiO_2$, SiN and SiON. Ideally, the PDL layer should be no more than 5 microns thick and desirably in the range of 0.2-3.0 microns.

Figure 10:
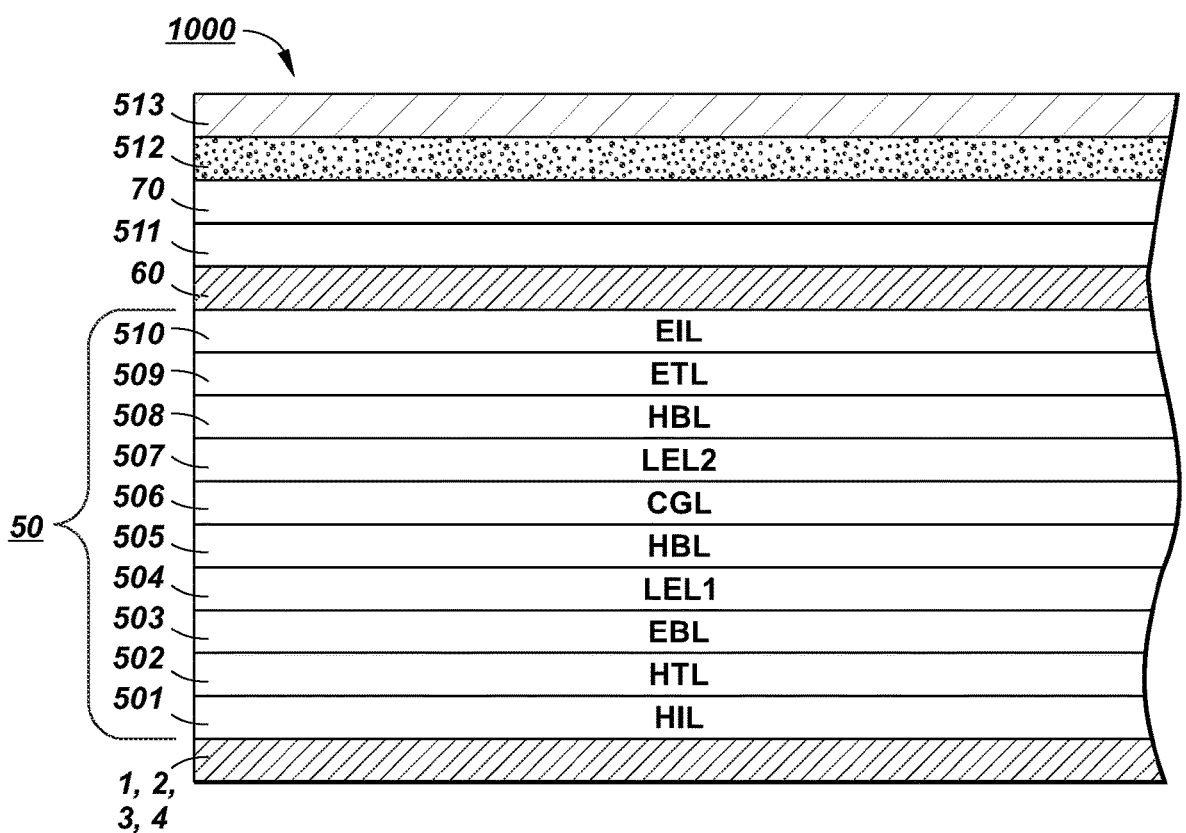
FIG. 10 shows a cross-sectional schematic for a two stack OLED formulation 1000.

FIG. 10 shows a typical composition of OLED layer types for light emission in an OLED device 1000. There will be one or more light-emitting layers with multiple auxiliary layers to help promote and control the movement of charge between the electrodes during light emission. In this particular example, the bottom electrode segment is an anode and the top electrode is a cathode.

Over the transparent electrode segment, there may be a hole-injection layer (HTL, Layer 501) as needed. The purpose of an HIL is to manage the transport of holes from the organic layers to the anode. Suitable hole-injection materials are well-known and commonly used. These layers may be mixtures of such materials and may contain dopants to modify their properties. Since it is non-light emitting, it does not contain emitting materials. There is generally only one HIL present. The choice of appropriate materials is not critical and any may be selected based on their performance. One example of a suitable HIL material is HAT-CN.

Over the HIL (Layer 501) is located a hole-transport layer (HTL, Layer 502). The purpose of an HTL is to manage the transport of holes from HIL to the light-emitting layers above. Suitable hole-transport materials are well-known and commonly used. These layers may be mixtures of such materials and may contain dopants to modify their properties. Since it is non-light emitting, it does not contain emitting materials. There may be multiple HTLs present. The choice of appropriate materials is not critical and any may be selected based on their performance. One example of a suitable HTL is NPB.

Over the HTL (Layer 502) is located an exciton-blocking layer (EBL; Layer 503) as needed. Light-emitting layers emit via the formation of excitons which in some cases, have sufficient lifetime to diffuse away from the site of its formation. The purpose of an EBL is to confine the excitons to the LEL to maximize light emission. Suitable exciton-transport materials are well-known and commonly used. These layers may be mixtures of such materials and may contain dopants to modify their properties. Since it is non-light emitting, it does not contain emitting materials. There may be multiple EBLs present. The choice of appropriate materials is not critical and any may be selected based on their performance. One example of a suitable EBL is mCP.

Over the EBL (Layer 503) is located a first light-emitting layer or unit (LEL1; Layer 504). A light-emitting layer (LEL), which is a single layer, generally contains one or more non-emitting host compounds and one or more light-emitting dopants. Host materials and fluorescent, phosphorescent and TADF light-emitting dopants suitable for use in light-emitting layers or units are well-known and commonly used. A light-emitting unit, as previously defined, could also be used for emission. The choice of appropriate materials is not critical and any may be selected based on their performance and emission characteristics.

Over LEL1 (Layer 504) is located a hole-blocking layer (HBL; Layer 505) as needed. Light-emitting layers emit via the formation of excitons which in some cases, are not formed sufficiently fast before holes migrate towards the cathode. The purpose of an HBL is to confine the holes to the LEL to maximize light emission. Suitable hole-blocking materials are well-known and commonly used. These layers may be mixtures of such materials and may contain dopants to modify their properties. Since it is non-light emitting, it does not contain emitting materials. There may be multiple HBLs present. The choice of appropriate materials is not critical and any may be selected based on their performance. One example of a suitable HBL is SF3-TRZ.

Over the HBL (Layer 505) is located a charge generating layer (CGL; Layer 506). CGLs (sometimes also referred to as connector or intermediate layers) are located between the individual OLED light-emitting units and typically consist of multiple layers. This is because the CGLs are structured so that electrons and holes are generated upon voltage application, and injected to the adjacent organic emissive layers. Hence, the use of a CGL can possibly convert one injected electron to multiple photons, allowing for higher luminance. In particular, it is desirable that a CGL is located between each light-emitting unit within the stack. However, it is not necessary for a light-generating unit to have an adjacent CGL on both sides. The OLED light-generating units on the top and bottom of the stack will generally have only one adjacent CGL. There is typically no need to use a CGL between a light-emitting unit and one of the top or bottom electrodes, although a CGL could be used if desired.

Many different kinds of CGLs have been proposed and may be used in the OLED stack. For example, see U.S. Pat. No. 7,728,517 and US2007/0046189. For the formation of a CGL, an n-p semiconductor heterojunction, which is located at the interface of n-type and p-type layers, is typically needed for the charge generation. Thus, CGLs will have two or more layers. For example, n-doped organic layer/transparent conductive layer, n-doped organic layer/insulating material, n-doped organic material layer/metal oxide layer, and n-doped organic material layer/p-doped organic material layer have all been reported. A desirable metal oxide for CGLs is MoO₃. In some instances, the n-layer and p-layer may be separated by a thin intermediate layer. Often, the CGL is arranged so that the n-layer is closer to the anode and the p-layer is closer to the cathode.

One desirable formulation for a CGL has three layers; an electron-transport material doped with a n-dopant (for example, Li), a thin intermediate layer of the same (but undoped) electron-transport material, and a hole-transport material doped with a p-dopant. Another desirable formulation for a CGL would have the same type of doped ETL, with an interlayer of a different electron-transport material and an electron deficient hole-injection material such as HAT-CN. Another desirable formulation for a CGL have an undoped ETL layer, a layer of Li or Ca, an interlayer of the same or different electron-transport material and an electron deficient hole-injection material or a hole-transport material doped with a p-dopant Suitable electron-transport and hole-injection or transport materials, along with n-dopants and p-dopants suitable for use in a CGLs are well-known and commonly used. The materials may be organic or inorganic. The choice of appropriate materials is not critical and any may be selected based on their performance. The thickness of the CGL should desirably be in the range of 200-450 Å, although in some examples, a thinner CGL may be in the range of 100-200 Å. In many instances, the CGL will have an ETL or HBL on the anode side and an HTL or EBL on its cathode side to help improve charge transport and help separate the charge-generating dopants (if present) from the LEL in the light-emitting units. There may be multiple such layers and may be doped or undoped as desired.

Over the CGL (Layer 506), is located a second light-emitting layer or unit (LEL2; Layer 507) representing the second stack of the OLED device. In FIG. 10, the two LELs (Layers 504 and 507) are separated by a CGL (Layer 506) and so, the OLED stack in FIG. 10 is a "two-stack" (or double-stacked) OLED. There may be one or more HTLs (doped or undoped) between the CGL (Layer 506) and LEL2 (Layer 507). LEL2 may emit the same color as LEL1 or a different color.

Over LEL2 (Layer 507) is located at least one HBL (Layer 508) similar to that described as Layer 505.

Over the HBL (Layer 508) is located an electron-transport layer (ETL; Layer 509). The purpose of the ETL is to manage the transport of electrons from the EIL to the light-emitting layers below. Suitable electron-transport materials are well-known and commonly used. These layers may be mixtures of such materials and may contain dopants to modify their properties. Since it is non-light emitting, it does not contain emitting materials. There may be multiple ETLs present. The choice of appropriate materials is not critical and any may be selected based on their performance. One example of a suitable ETL is TPBI.

Over the ETL (Layer 509) is located an electron-injecting layer (EIL; Layer 510) as needed. The purpose of the EIL is to manage the transport of electrons to the organic layers from the cathode. Suitable electron-injection materials are well-known and commonly used. These layers may be mixtures of such materials and may contain dopants to modify their properties. Since it is non-light emitting, it does not contain emitting materials. There is generally only one EIL present. The choice of appropriate materials is not critical and any may be selected based on their performance. One example of a suitable EIL material is LiF.

Over the organic layers for light emission (50; Layers 501-510 in FIG. 10), there is a top electrode 60 which in FIG. 10 is a cathode. It is desirably composed of a thicker layer of metal or metal alloy such as Al, Ag, Mg/Al, Mg/Ag and the like. The second electrode may be deposited by any known technique. The second electrode may be patterned in non-emissive areas, but generally is deposited uniformly over the emission area. There needs to be contact area (contact pad) that is external to the encapsulation that is electrically connected to the top electrode within the encapsulation for external power supply. Some examples of suitable materials for the top electrode are Al, Al/Mg, Ag/Mg and Ag.

There may be optional protective or spacing layers (Layer 511 in FIG. 10) over the top electrode to prevent damage during encapsulation. These may be small molecule organic, polymeric or inorganic materials. Organic materials are preferred.

Over the reflective cathode and any optional protective layers, if present, is deposited or placed encapsulation 70. At a minimum, the encapsulation should fully cover the light-emitting area on the top and sides and is in direct contact with the substrate. The encapsulation should be impervious to air and water penetration. It may be transparent or opaque. It should not be electrically conductive. It may be formed in-situ or added as a separate pre-formed sheet along with provisions for sealing the side edges.

An example of in-situ formation would be thin-film encapsulation. Thin-film encapsulation involves the deposition of multiple layers with alternative layers of inorganic materials and polymeric layers until the desired degree of protection is achieved. Formulations and methods to form thin-film encapsulation are well known and any can be used as desired.

Alternatively, encapsulation may be provided using a pre-formed sheet or cover slip which is attached over at least a sealing area and enclosed area. The pre-formed sheet may be rigid or flexible. It could be made of glass (including flexible glass), metal or organic/inorganic barrier layers. It should have a thermal expansion coefficient that is close to the substrate to achieve a more robust connection. Pre-formed encapsulation sheets may need to be attached over the sealing area using air and water proof adhesives such as silicon or epoxy adhesives or by thermal means such as ultrasonic welding or glass frit welding, which may require additional sealants such as solder or glass frit. The side and bottom edges of the cover slip can be specially designed to have better fit to the sealing area or promote a better seal. The cover slip and sealing area may be designed together so that they fit or lock partially in place before the seal is formed. Moreover, the cover slip may be pretreated to promote better adhesion to the sealing area.

For some applications, an increased degree of encapsulation is necessary. This can be accomplished by providing an additional metal foil encapsulation (Layer 513) which is attached over the encapsulation 70 by a pressure-sensitive adhesive (Layer 512). Not only does the use of a metal foil provide robust encapsulation, it also acts as a heat sink to prevent excessive heating which is deleterious to OLED devices.

For many applications, a single stack OLED device can provide sufficient emission for the intended purpose. For some applications, more luminance is required than can be provided by a single OLED stack. In such cases, two (as shown for FIG. 10) or more stacks will be required. Generally speaking, adding an OLED stack (i.e., two units instead of one) will double the luminance produced, although the power required is also doubled. Three-stack OLEDs will produce 3× the luminance but require 3× the power and so forth. In the segmented OLED device of the invention, as many stacks necessary to produce the desired amount of luminance can be added; the only limitation being the increased voltage necessary to drive the device. Desirably, there are at least two stacks and as many as six stacks in the segmented OLED device.

Another method of increasing luminance, particularly when single color emission is desired, from an OLED is to incorporate the microcavity effect. To form a microcavity, one electrode is reflective and the other is semi-transparent so light is reflected internally. Depending on the distance between the two electrodes, interference will occur and some wavelengths of light will be eliminated or reduced, while other wavelengths will be enhanced. The microcavity effect can be used for the OLED segments of the OLED device.

While the various individual LELs or units within the segmented OLED device are not limited to providing the same color, some applications require monochromatic emission. For example, for many automotive tail-light applications, all LELs or units should produce red light. It should be noted that although different LELs or units all might produce the same color of light; it is not necessary that all have identical emission spectrums; some may have a different proportion of certain wavelengths from another (i.e., one unit produces a spectrum with more short red wavelengths while another produces more longer red wavelengths).

Because the presence of the refractive-reduction material enables the power feeds to be located under the segmented electrodes, such an arrangement is particularly suitable for applications where one OLED segment completely surrounds another OLED segment but are separately controlled. This is illustrated in FIGS. 11A-11C.

Figure 11A:
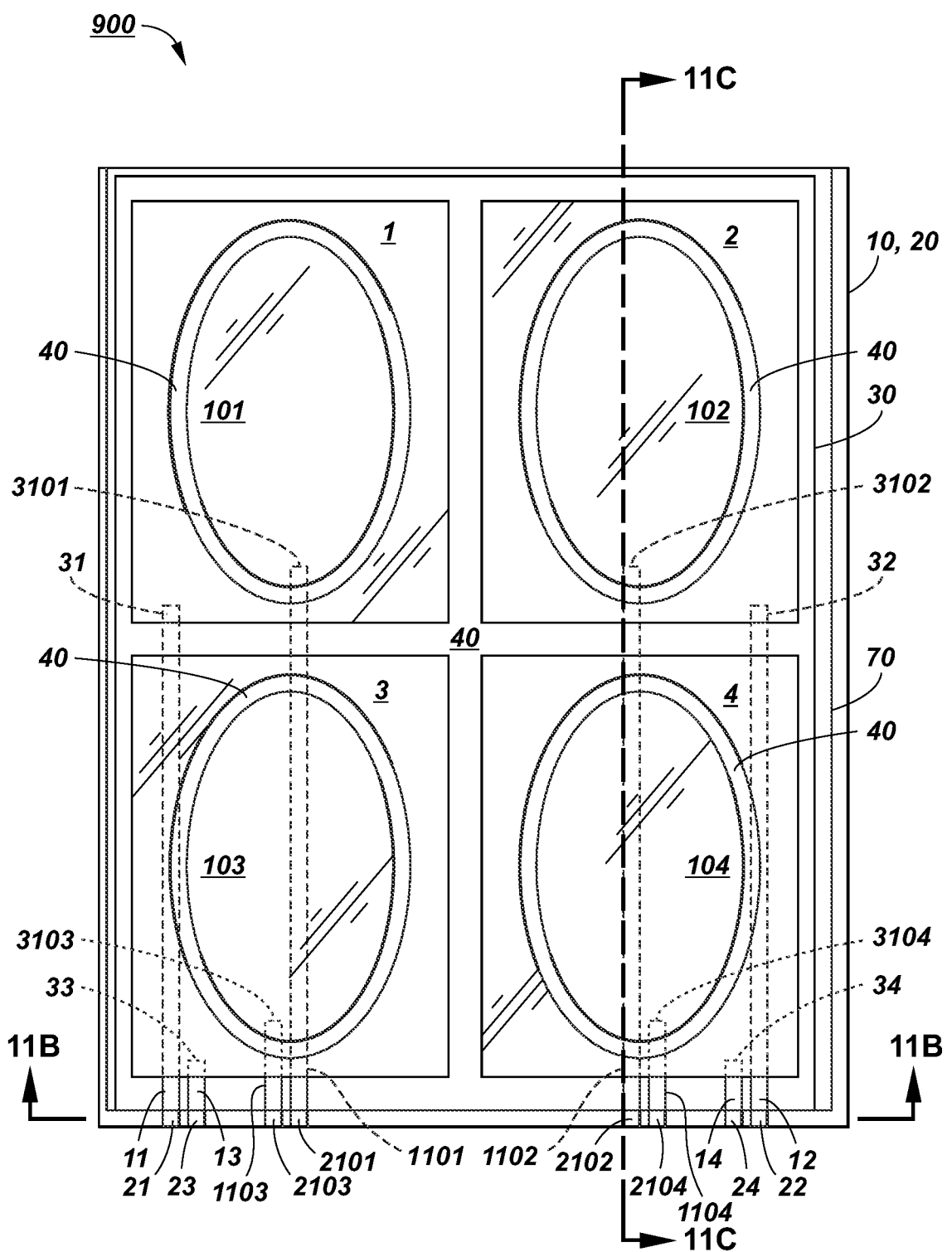
FIG. 11A shows a top-view of an inventive segmented OLED device 900 where some segments are entirely surrounded by another segment.

FIG. 11A shows a segmented OLED device 900 similar in structure to 200 (FIG. 2A) but the larger segmented electrodes 1, 2, 3 and 4 are further segmented into smaller segmented electrodes 101, 102, 103 and 104. In 900, 101, 102, 103 and 104 are oval shaped and completely surrounded on all sides by rectangular shaped segmented electrodes 1, 2, 3 and 4. Segmented electrodes 101, 102, 103 and 104 are all laterally separated from surrounding segmented electrodes 1, 2, 3 and 4 by PDL 40 or another insulating material so they are not in electrical contact. Segmented electrodes 101, 102, 103 and 104 are correspondingly controlled by power feeds 1101, 1102, 1103 and 1104 with external contact pads 2101, 2102, 2103 and 2104 and vias (through the insulating layer 30) 3101, 3102, 3103 and 3104. Because these segments are entirely contained within another segment, the power feeds to the internal segments must run directly under some part of the active emissive area of the surrounding segment.

Figure 11B:
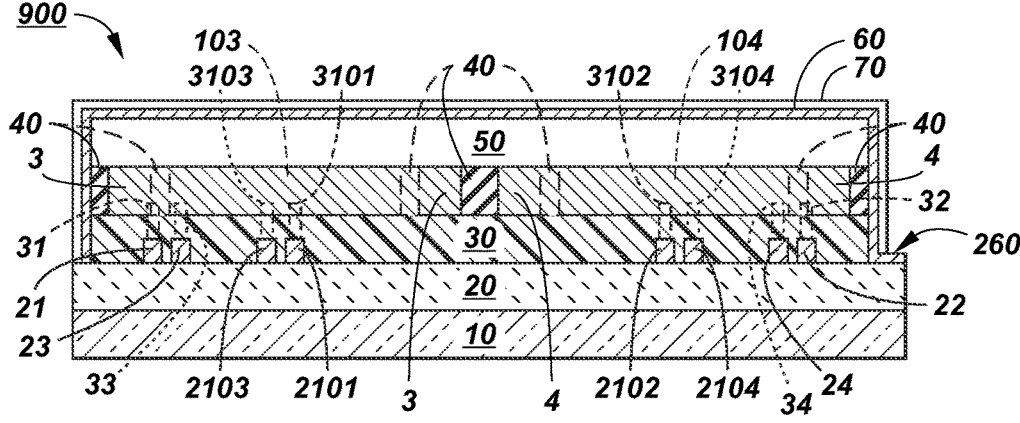
FIG. 11B shows an edge-on view of 900.

FIG. 11B shows an edge-on view of OLED device 900 viewed from the side closest to electrode segments 3 and 4) similar to that in FIGS. 2B and 3B. Compared to OLED device 200, 900 has 4 additional power leads that will control the internal segments 101, 103, 102 and 104. In this view from the edge, only the bottom electrode contact areas 2103, 2101, 2102 and 2104 are directly visible, but the corresponding power feeds 1103, 1101, 1102 and 1104 extend directly behind the contact areas. The vias 3103, 3101, 3102 and 3104 extend from the power feeds through the insulating layer 30 to the segmented electrodes 103, 101, 102 and 104. A pixel definition layer (PDL) 40 is present in the gaps between all of the electrode segments as well as along the outside edges. Over the PDL 40 and electrode segments 1, 2, 3, 4, 101, 102, 103 and 104 are OLED layers 50 for light emission as well a top electrode 60. Along one edge, there is an extension of the top electrode 60 to the edge of the substrate 10 to form a contact area 260. Over the top electrode 60 is encapsulation 70, leaving the bottom electrode contact areas 21, 23, 24, 22, 2101, 2103, 2104, 2102 and top electrode contact area 260 exposed.

Figure 11C:
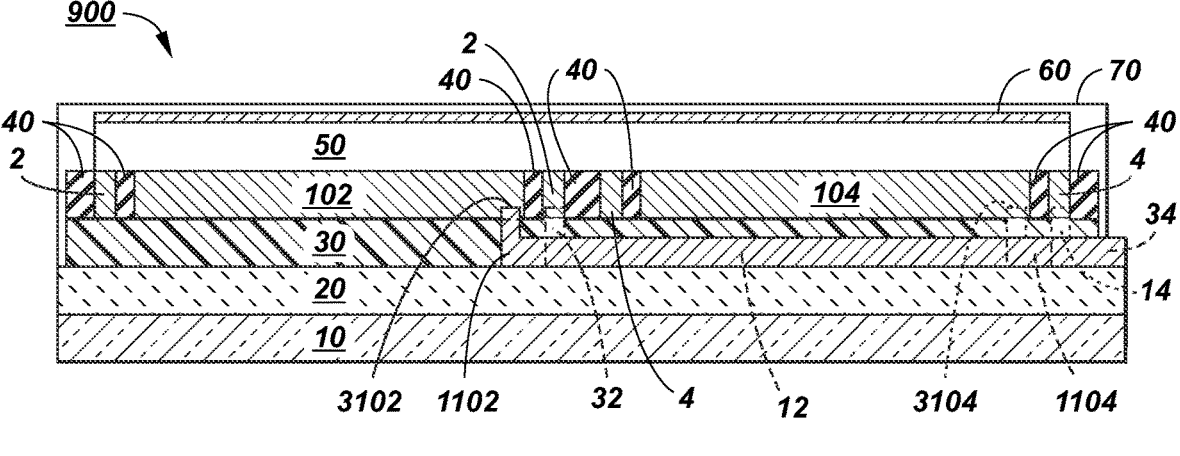
FIG. 11C shows a cross-section along a different axis from FIG. 11B of 900.

FIG. 11C shows a cross-section of OLED device 900 viewed from the left along the indicated line. In this view, longer power feed 1102 obscures the shorter power feeds 1104, 14 and 12. However, additional power feeds 1102 and 12 (obscured in this view) are longer and so can be seen as extending to the corresponding segmented electrodes 101 and 102 (directly behind 101).

The segmented OLED device 900 has common organic layers for light emission 50 across all electrode segments. This results in the same emission from all OLED segments, even though the internal segments are separately controlled from the surrounding segments. This design allows for great flexibility for controlling the patterns produced by the device.

However, in some applications, it would be desirable that all or some of the internal segments in the array emit a different color of light from the surrounding segment. For example, for some automotive tail-light application designs, it might be desirable to have an internal segment emit W, Y, Amber or Orange light while the surrounding segment emits R light. This will require patterning the organic layers 50 above each segment appropriately. In such designs, the organic layers for each differently emitting segment should be laterally separated from the neighboring segments. The top electrode can be common across all segments. For one example of a device with differently emitting segments, see 800 in FIG. 9. Alternatively, the OLED segments can produce W or a multimodal emission and the different emissions generated by use of color filters.

Figure 12A:
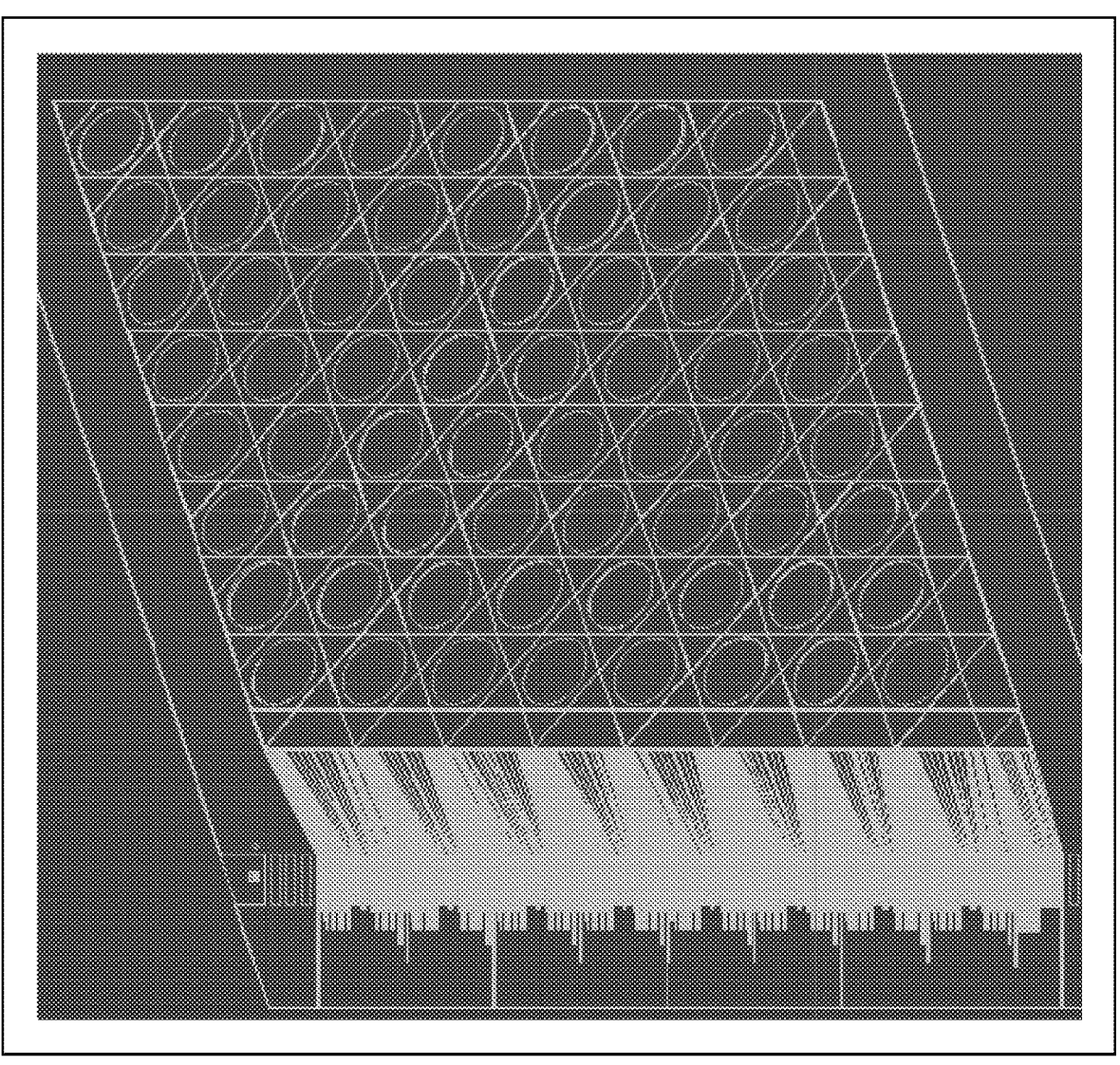
FIG. 12A is a top view of an inventive segmented OLED device where some segments are entirely surrounded by another segment.

FIG. 12A shows a top-view of a segmented OLED device with a layout that includes an array of OLED segments where some of the individual OLED segments (oval shaped) are completely surrounded by another segment (hexagon shaped). In this example, there are with 290 segments including ovals, triangles, hexagonal border around ovals and ½ hexagons. FIGS. 12B (enlarged view of a section of FIG. 12A) and 12C (enlarged view of a section of FIG. 12B) show a top-view of the layout of the power leads of the segmented OLED device of FIG. 12A before the addition of the overlying layers. There are 290 power feeds (one for each OLED segment). FIG. 12C illustrates that the power feeds may get wider as they extend to top of the emission area (away from the external contact areas). It is important for larger segments to have wider bus lines to minimize voltage drop. Reducing resistance in some power feeds relative to others provides a similar voltage drop for all segments without regard to the distance from the power source or segment size.

Figure 13:
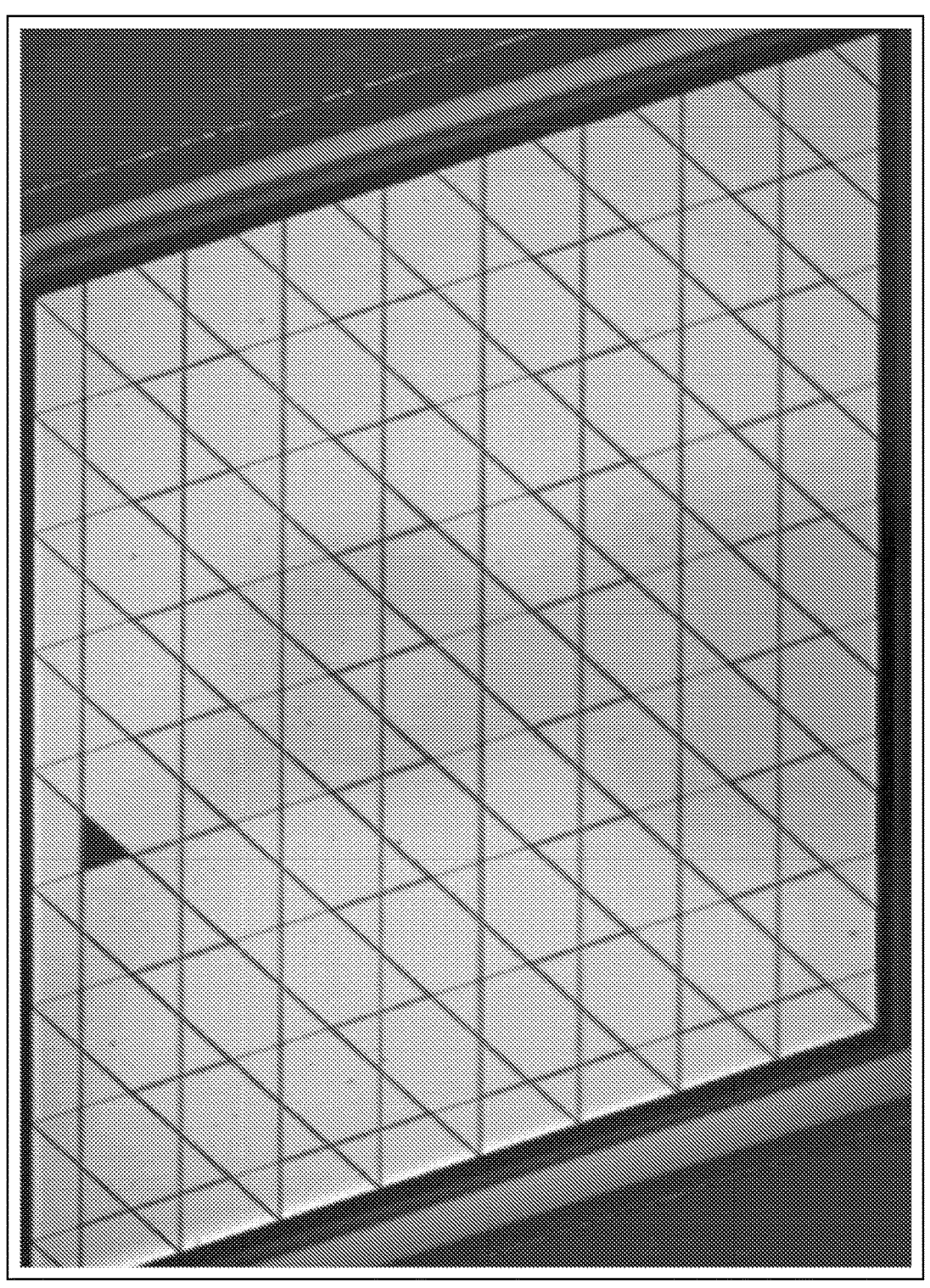
FIG. 13 is a top-view photograph of an inventive bottom-emitting segmented OLED device where the power feeds to the individual OLED segments, which are located below the electrode segment and in the light path of emission, are not visible because of the presence of the refraction-reduction material.

FIG. 13 is a top-view of a bottom-emitting segmented OLED device where the power leads are located under the electrode segments and in the emission light path but with a refraction-reduction layer. As in FIG. 1 without the refraction-reduction layer, the OLED segments are arranged in an array of triangles and hexagons with non-light emitting gaps between them. The underlying power feeds are made of ITO formed on a refraction-reduction layer and are separated from the overlying electrode segments by a polymeric insulating layer. Unlike the prior art device shown in FIG. 1, the power feeds are not visible at all.

In some applications, the parts of the upper surfaces of at least some of the segmented electrodes could be patterned with an insulating material. This could be used to create permanently dark (non-emitting) designs that are visible whenever the OLED segment is emitting. This could be used to add designs such as stripes, dots, images, and logos.

One method for making a segmented OLED device with an array of OLED segments with reduced visibility of power feeds located in the emission light path (such as 200) would comprise, in order, the steps of:

1) Depositing a layer of non-electrically conductive refraction-reduction material on a transparent substrate;

2) Patterning electrically conductive power feeds directly over and in contact with the refraction-reduction such that there will be one power feed for each OLED segment;

3) Depositing a non-electrically conductive insulating layer over the power feeds and the lateral spaces between the power feeds;

4) Forming vias in the insulating layer over the power feeds to expose the upper surface of the power feeds;

5) Filling the vias with an electrically conductive material;

6) Patterning bottom electrode segments over the insulating layer so that it is in electrical contact with the power feed through the filled via;

7) Depositing organic layers for light emission over the electrode segments;

8) Depositing a top electrode over the organic layers; and

9) Forming encapsulation over the top electrodes.

Another method for making a segmented OLED device with an array of OLED segments with reduced visibility of power feeds located in the emission light path (such as 300) would comprise, in order, the steps of:

1) Depositing electrically conductive power feeds over a transparent substrate such that there will be one power feed for each OLED segment;

2) Depositing a refraction-reduction material at least between and in direct contact with the power feeds;

3) Depositing a non-electrically conductive insulating layer over the refraction-reduction material and power feeds;

4) Forming vias in the insulating layer over the power feeds to expose the upper surface of the power feeds;

5) Filling the vias with an electrically conductive material;

6) Patterning bottom electrode segments over the insulating layer so that it is in electrical contact with the power feed through the filled via;

7) Depositing organic layers for light emission over the electrode segments;

8) Depositing a top electrode over the organic layers; and

9) Forming encapsulation over the top electrodes.

Some useful variations in both of these methods include:

Where the power feeds are patterned directly over the transparent substrate and then the refraction-reduction material is deposited at least between the power feeds, the refractive-reduction material may cover the upper surface of the power feeds as well. In this embodiment, the insulating layer is optional.

The step of patterning the electrode segments includes forming a non-electrically conductive pixel definition layer between the segments.

Filling the vias and patterning the electrode segments occur in the same step.

Selecting the materials of the power feeds and refractive-reduction material so that the reflectance difference ($D_R$) between the regions of the transparent substrate where the power feeds are located and the regions of the transparent substrate where the gaps between the power feeds are located should be 5% or less, or preferably 1% or less.

The ratio of the $R_I$ of the power feeds and $R_I$ of the refraction-reduction material (higher $R_I$/lower $R_I$) is in the range of 1.00 to 1.06, or preferably in the range of 1.00 to 1.03.

Some desirable physical and performance characteristics for the segmented OLED device with the refraction-reduction layer include:

Brightness: 2,000-20,000 cd/m;

Number of OLED Segments: >200 (can be mix of sizes and shapes);

Active Area: 25 cm$^2$ or greater;

Segment Size: <5 mm$^2$;

Current density for 2000 cd/m$^2$: 13 mA/cm$^2$ (2-stack), 4.3 mA/cm$^2$ (6-stack);

Current density for 5000 cd/m$^2$: 32 mA/cm$^2$ (2-stack), 9 mA/cm$^2$ (6-stack);

Current Density for 10000 cd/m2: 25 mA/cm2 (6-stack);

Current Density for 20000 cd/m2: 50 mA/cm2 (6-stack);

Non-emitting gap: <1 mm, preferably <700 μm, and most preferable <200 μm; and

All electrical contact areas (bottom and top electrodes) outside the encapsulation are located along only one edge of device.

The above description describes a number of different embodiments. Individual features from any of the embodiments may be combined without limitation.

In the above description, reference is made to the accompanying drawings that form a part hereof, and in which are shown by way of illustration specific embodiments which may be practiced. These embodiments are described in detail to enable those skilled in the art to practice the invention, and it is to be understood that other embodiments may be utilized and that structural, logical and electrical changes may be made without departing from the scope of the present invention. The description of any example embodiments is, therefore, not to be taken in a limiting sense. Although the present invention has been described for the purpose of illustration, it is understood that such detail is solely for that purpose and variations can be made by those skilled in the art without departing from the spirit and scope of the invention.

PARTS LIST

1, 2, 3, 4 Bottom Segmented Electrode
11 Power Feed for Segmented Electrode
21 External Contact Area for Power Feed 11
31 Via from Power Feed 11 to Segmented Electrode 1
2, 12, 22, 32 Segmented Electrode. Power Feed, Contact Area, Via
3, 13, 23, 33 Segmented Electrode. Power Feed, Contact Area, Via
4, 14, 24, 34 Segmented Electrode. Power Feed, Contact Area, Via
10 Common Transparent Substrate
20 Common Index-matching or high refractive Layer
30 Insulating Layer
40 Pixel Definition Layer between Segmented Electrodes
50 Organic Layers for Light Emission
50A, 50B, 50C, 50D Segmented Organic Layers for Light Emission
60 Top Electrode
260 External Contact Area for Top Electrode
70 Encapsulation
75 Light Emitting Area
80 Non-Light Emitting Gaps between OLED Segments
85 Gaps between power feeds
101 Surrounded Segmented Bottom Electrode
1101 Power Feed for Bottom Electrode 101
2101 External Contact Area for Power Feed 1101
3101 Via from Power Feed 1101 to Segmented Electrode 101
102, 1102, 2102, 3102 Segmented Electrode. Power Feed, Contact Area, Via
103, 1103, 2103, 3103 Segmented Electrode. Power Feed, Contact Area, Via
104, 1104, 2104, 3104 Segmented Electrode. Power Feed, Contact Area, Via
100-900 Segmented OLED Devices
1000 OLED Device
501 HIL
502 HTL
503 EBL
504 LEL1
505 HBL
506 CGL
507 LEL2
508 HBL
509 ETL
510 EIL
511 Optional Protection Layer
512 Pressure Sensitive Adhesive
513 Metal Foil Encapsulation/Heat Sink

The invention claimed is:

1. An OLED device comprising an array of multiple independent bottom-emitting OLED segments arranged on a common transparent substrate, each individual OLED segment being separated by a non-emitting gap;

wherein each OLED segment is defined by a transparent bottom electrode segment which is not in electrical contact with any other electrode segment, together with a top electrode and organic layers for light emission between the top electrode and bottom electrode segments;

where each segmented bottom electrode is electrically connected to an individual power feed, wherein at least some of the power feeds are arranged between the bottom electrode segments and the transparent substrate within the emission light path; and includes at least one refraction-reduction material located between the segmented bottom electrode and the transparent substrate to reduce visibility of individual power feeds.

2. The OLED device of claim 1 wherein the refraction-reduction material is located between the bottom side of the bottom electrode segments and the upper side of the power feeds; and/or between the bottom side of the power feeds and the upper side of the transparent substrate; and/or between the lateral spaces separating the individual power feeds.

3. The OLED device of claim 2 wherein the refraction-reduction material is a continuous layer located between the bottom side of the bottom electrode segments and the upper side of the power feeds.

4. The OLED device of claim 3 wherein the refraction-reduction material is additionally located in the lateral spaces separating the individual power feeds.

5. The OLED device of claim 2 wherein the refraction-reduction material is located between the bottom side of the bottom electrode segments and the upper side of the power feeds; and wherein there is an additional insulating layer located between the upper surface of the power feeds and the bottom surface of the bottom electrode segment.

6. The OLED device of claim 5 wherein the insulating layer is located between the refraction-reduction material and the bottom side of the bottom electrode segments.

7. The OLED device of claim 1 where the reflectance difference (DR) between the regions of the transparent substrate where the power feeds are located and the regions of the transparent substrate where the gaps between power feeds are located is 5% or less.

8. The OLED device of claim 7 where the ratio (higher RI/lower RI) of the refractive index RI of the power feed and the refractive index RI of the refraction-reduction material is in the range of 1.00 to 1.06.

9. The OLED devices of claim 8 where the refraction-reduction material comprises two or more inorganic materials with different refractive indexes.

10. The OLED device of claim 9 where the power feeds are formed from conductive metal oxide and the refraction-reduction material is a mixture of $Nb_2O_5$ and $SiO_2$.

11. The OLED device of claim 8 where the refraction-reduction material comprises a suspension of inorganic particles in an organic polymer.

12. The OLED device of claim 11 where the power feeds are formed from conductive metal oxide and the refraction-reduction material is a mixture of inorganic nanoparticles suspended in a polymer matrix comprising polymeric siloxanes with high molecular weight organic functional groups.

13. The OLED devices of claim 1—where all of the OLED segments in the array emit the same color of light.

14. The OLED device of claim 1 where some of the OLED segments emit a different color of light from other segments.

15. The OLED device of claim 1 where at least one of the OLED segments in the array is located within and is entirely surrounded by another OLED segment.

16. The OLED device of claim 1 where the OLED device is used for exterior automotive lighting applications.

17. The OLED device of claim 1 wherein:

for devices with a total emission area of 500 cm$^2$ or less, the individual OLED segments have an emission area of at least 1 mm$^2$; or for devices with a total emission area of greater than 500 cm$^2$, the individual OLED segments have an emission area of at least 0.25 cm$^2$.

* * * * *